US012581706B2

(12) United States Patent
Hu et al.

(10) Patent No.: US 12,581,706 B2
(45) Date of Patent: Mar. 17, 2026

(54) METAL-OXIDE THIN-FILM TRANSISTOR AND METHOD FOR MANUFACTURING SAME, X-RAY DETECTOR, AND DISPLAY PANEL

(71) Applicant: BOE TECHNOLOGY GROUP CO., LTD., Beijing (CN)

(72) Inventors: Hehe Hu, Beijing (CN); Fengjuan Liu, Beijing (CN); Guangcai Yuan, Beijing (CN); Jiayu He, Beijing (CN); Ce Ning, Beijing (CN); Zhengliang Li, Beijing (CN); Kun Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 606 days.

(21) Appl. No.: 17/798,347

(22) PCT Filed: Oct. 22, 2021

(86) PCT No.: PCT/CN2021/125799
§ 371 (c)(1),
(2) Date: Aug. 9, 2022

(87) PCT Pub. No.: WO2022/193649
PCT Pub. Date: Sep. 22, 2022

(65) Prior Publication Data
US 2024/0186379 A1 Jun. 6, 2024

(30) Foreign Application Priority Data
Mar. 15, 2021 (CN) .......................... 202110276323.3

(51) Int. Cl.
*H10D 62/17* (2025.01)
*H01L 21/385* (2006.01)
(Continued)

(52) U.S. Cl.
CPC ......... *H10D 62/299* (2025.01); *H01L 21/385* (2013.01); *H10D 30/6755* (2025.01); *H10D 62/80* (2025.01); *H10D 99/00* (2025.01)

(58) Field of Classification Search
None
See application file for complete search history.

(56) References Cited

U.S. PATENT DOCUMENTS

| | | | |
|---|---|---|---|
| 7,691,691 | B1 | 4/2010 | Cleeves |
| 2003/0067037 | A1 | 4/2003 | Lu et al. |

(Continued)

FOREIGN PATENT DOCUMENTS

| | | |
|---|---|---|
| CN | 102351528 A | 2/2012 |
| CN | 106298879 A | 1/2017 |

(Continued)

OTHER PUBLICATIONS

Extended European search report of counterpart European application No. 21931224.6 issued on Oct. 17, 2023.

(Continued)

*Primary Examiner* — Yara B Green
*Assistant Examiner* — Fakeha Sehar
(74) *Attorney, Agent, or Firm* — Lippes Mathias LLP

(57) ABSTRACT

Provided is a method for manufacturing a metal-oxide thin-film transistor (TFT). The method includes: forming, on a base substrate, an active layer including a metal oxide semiconductor, and a functional layer laminated on the active layer and containing a lanthanide element; and annealing the active layer and the functional layer, such that the lanthanide element in the functional layer is diffused into the active layer.

7 Claims, 13 Drawing Sheets

(51) Int. Cl.

| | |
|---|---|
| *H10D 30/67* | (2025.01) |
| *H10D 62/80* | (2025.01) |
| *H10D 99/00* | (2025.01) |

(56) References Cited

U.S. PATENT DOCUMENTS

| | | | |
|---|---|---|---|
| 2012/0012835 A1 | 1/2012 | Herman et al. | |
| 2014/0134795 A1* | 5/2014 | Mochizuki | H10D 30/6755 |
| | | | 438/104 |
| 2015/0079728 A1 | 3/2015 | Yamazaki | |
| 2015/0214376 A1 | 7/2015 | Koezuka et al. | |
| 2018/0053839 A1 | 2/2018 | Chang et al. | |
| 2020/0027993 A1 | 1/2020 | Xu et al. | |
| 2021/0083125 A1 | 3/2021 | Xu et al. | |
| 2022/0199784 A1 | 6/2022 | Kawashima et al. | |

FOREIGN PATENT DOCUMENTS

| | | | |
|---|---|---|---|
| CN | 107146816 | A | 9/2017 |
| CN | 107464843 | A | 12/2017 |
| CN | 107527946 | A | 12/2017 |
| CN | 109888023 | A | 6/2019 |
| CN | 110767745 | A | 2/2020 |
| JP | 2010161327 | A | 7/2010 |
| JP | 2017017320 | A | 1/2017 |
| WO | 2020116499 | A1 | 6/2020 |
| WO | 2020196716 | A1 | 10/2020 |

OTHER PUBLICATIONS

Notice of Reasons for Refusal of Japanese application No. 2022-565666 issued on Aug. 26, 2025.
Communication pursuant to Article 94(3) EPC of European application No. 21931224.6 issued on Nov. 19, 2025.

\* cited by examiner

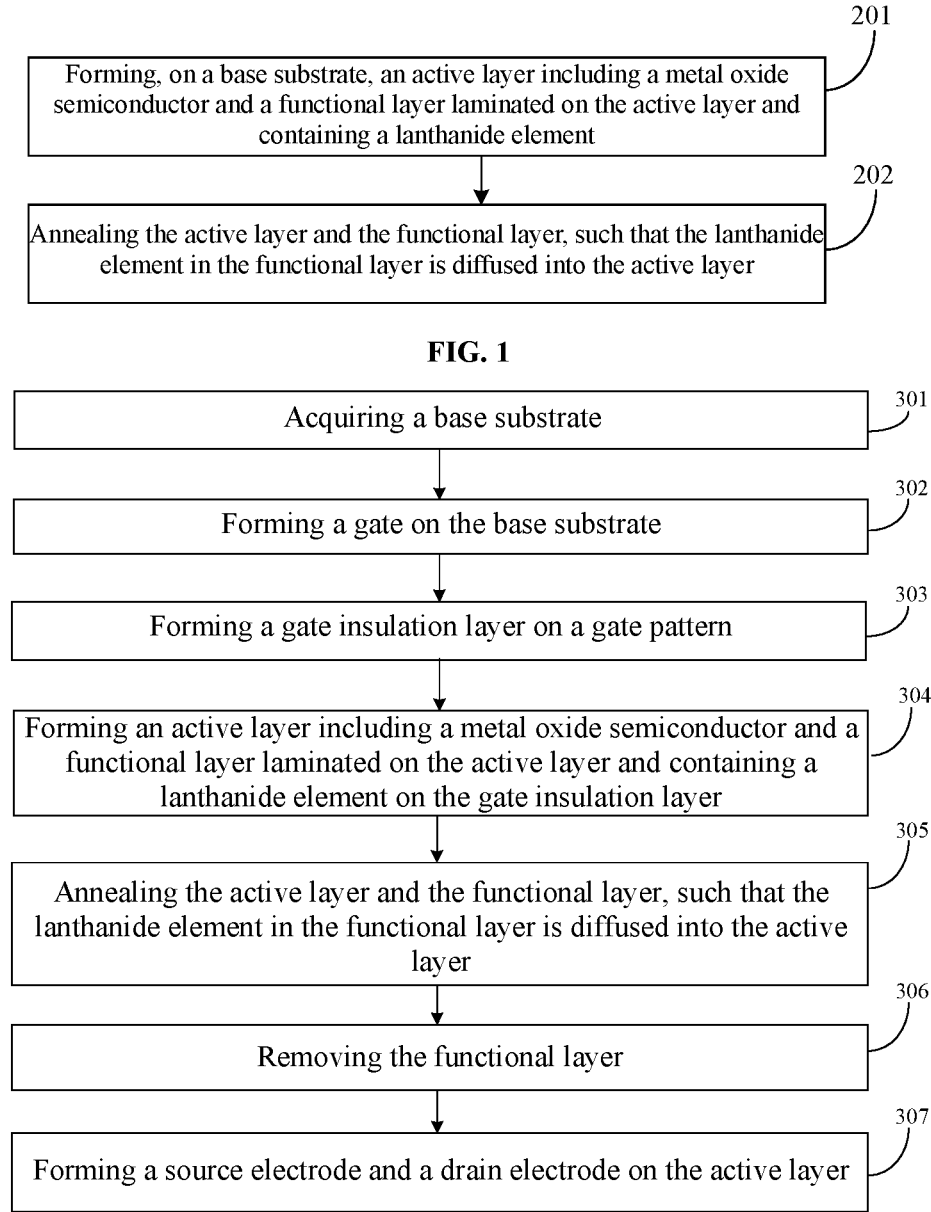

201

Forming, on a base substrate, an active layer including a metal oxide semiconductor and a functional layer laminated on the active layer and containing a lanthanide element

202

Annealing the active layer and the functional layer, such that the lanthanide element in the functional layer is diffused into the active layer

Acquiring a base substrate

302

Forming a gate on the base substrate

303

Forming a gate insulation layer on a gate pattern

304

Forming an active layer including a metal oxide semiconductor and a functional layer laminated on the active layer and containing a lanthanide element on the gate insulation layer

305

Annealing the active layer and the functional layer, such that the lanthanide element in the functional layer is diffused into the active layer

306

Removing the functional layer

307

Forming a source electrode and a drain electrode on the active layer

FIG. 2

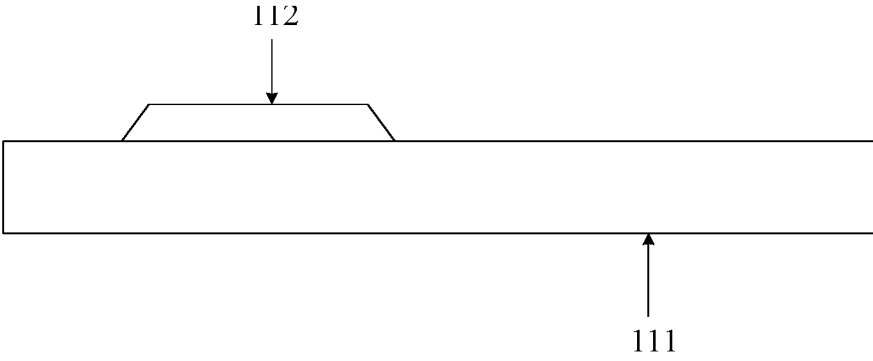

FIG. 3

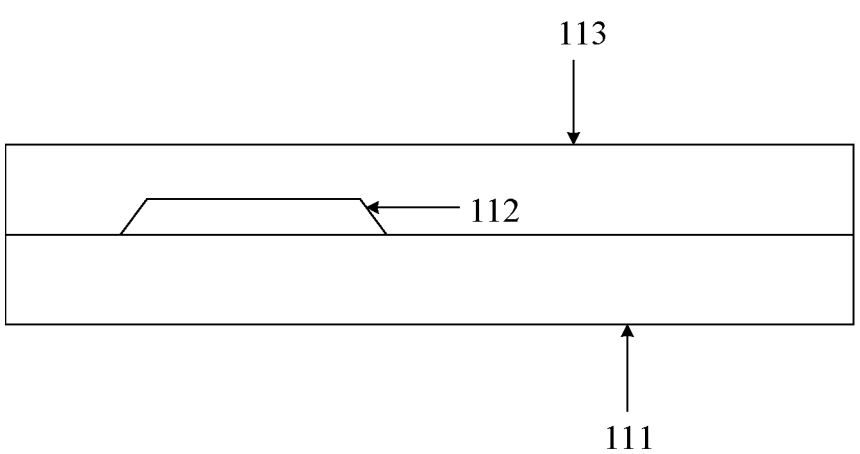

FIG. 4

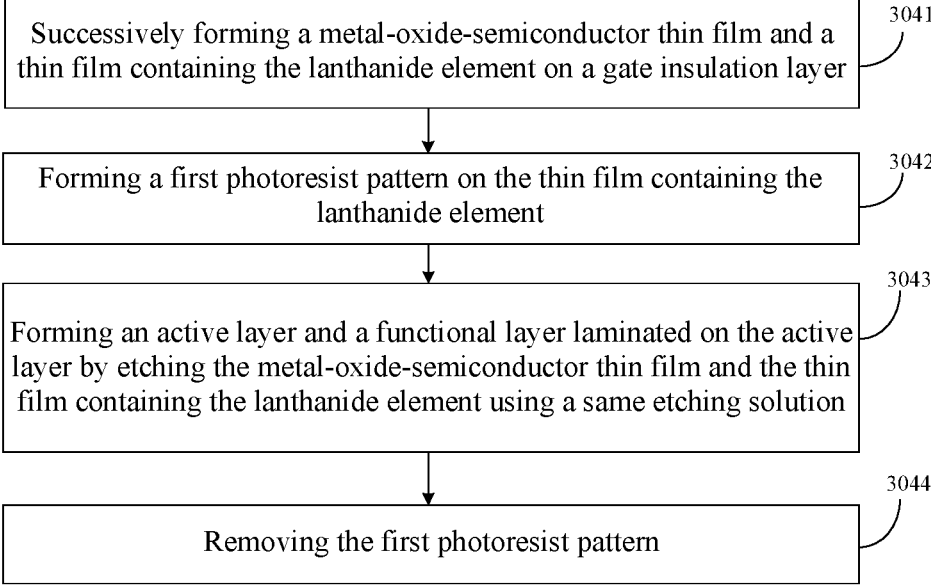

| |
|---|
| Successively forming a metal-oxide-semiconductor thin film and a thin film containing the lanthanide element on a gate insulation layer — 3041 |
| ↓ |
| Forming a first photoresist pattern on the thin film containing the lanthanide element — 3042 |
| ↓ |
| Forming an active layer and a functional layer laminated on the active layer by etching the metal-oxide-semiconductor thin film and the thin film containing the lanthanide element using a same etching solution — 3043 |
| ↓ |
| Removing the first photoresist pattern — 3044 |

FIG. 5

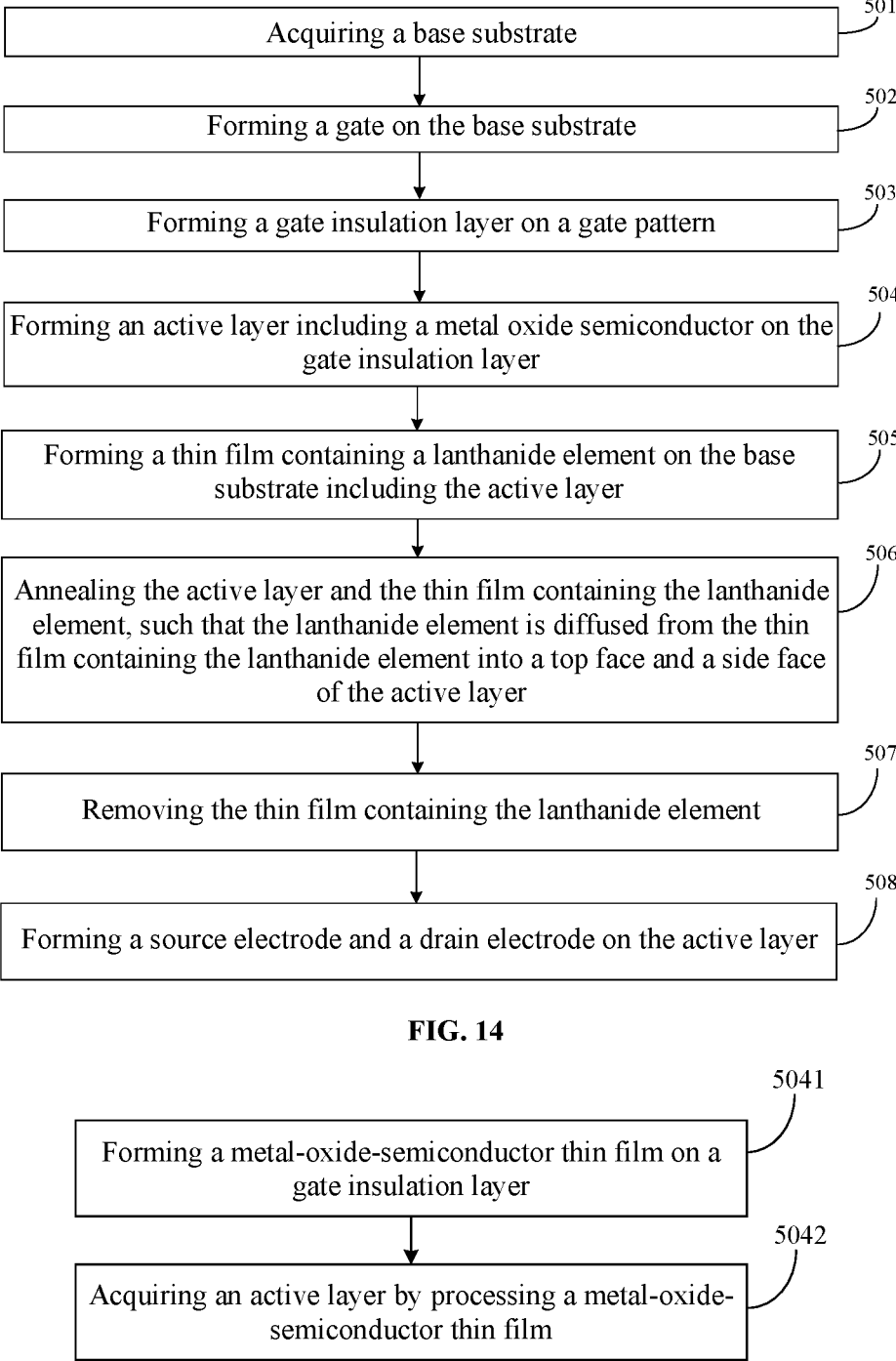

501

Acquiring a base substrate

502

Forming a gate on the base substrate

503

Forming a gate insulation layer on a gate pattern

504

Forming an active layer including a metal oxide semiconductor on the gate insulation layer

505

Forming a thin film containing a lanthanide element on the base substrate including the active layer

506

Annealing the active layer and the thin film containing the lanthanide element, such that the lanthanide element is diffused from the thin film containing the lanthanide element into a top face and a side face of the active layer

507

Removing the thin film containing the lanthanide element

508

Forming a source electrode and a drain electrode on the active layer

Forming a metal-oxide-semiconductor thin film on a gate insulation layer

5042

Acquiring an active layer by processing a metal-oxide-semiconductor thin film

FIG. 15

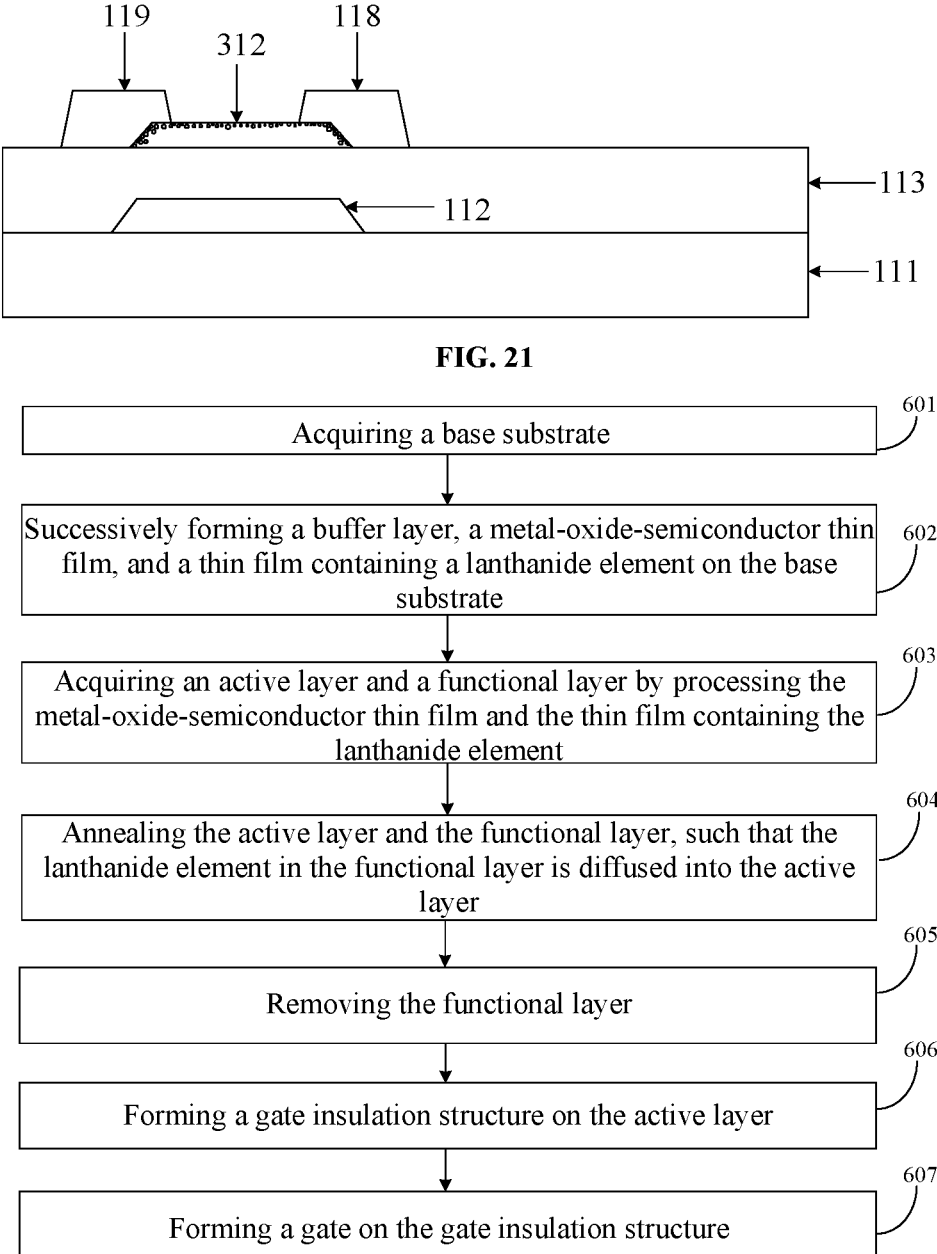

FIG. 21

| | |
|---|---|
| Acquiring a base substrate | 601 |
| Successively forming a buffer layer, a metal-oxide-semiconductor thin film, and a thin film containing a lanthanide element on the base substrate | 602 |
| Acquiring an active layer and a functional layer by processing the metal-oxide-semiconductor thin film and the thin film containing the lanthanide element | 603 |
| Annealing the active layer and the functional layer, such that the lanthanide element in the functional layer is diffused into the active layer | 604 |
| Removing the functional layer | 605 |
| Forming a gate insulation structure on the active layer | 606 |
| Forming a gate on the gate insulation structure | 607 |

FIG. 22

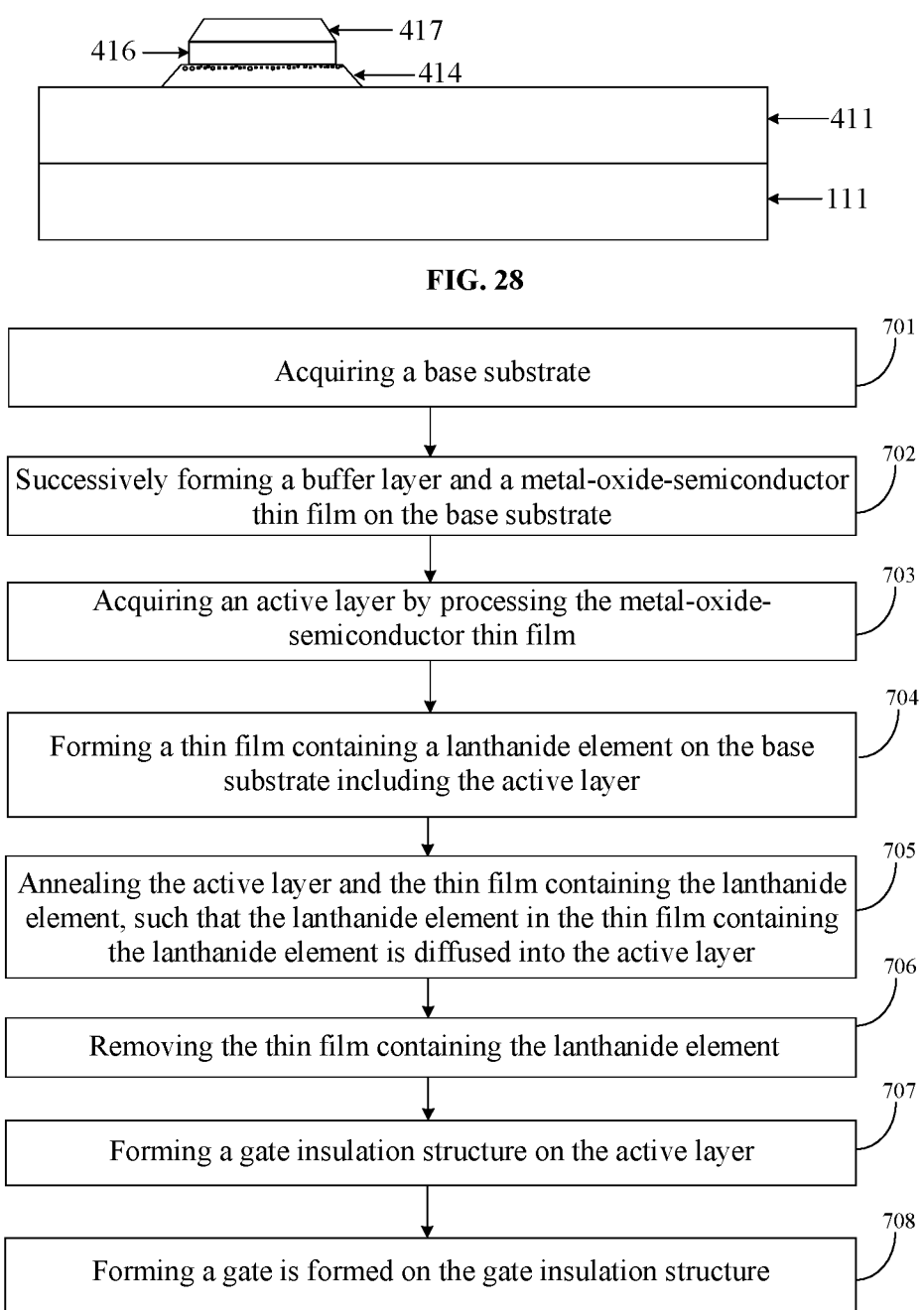

FIG. 28

| |
|---|
| Acquiring a base substrate |
701

| |
|---|
| Successively forming a buffer layer and a metal-oxide-semiconductor thin film on the base substrate |
702

| |
|---|
| Acquiring an active layer by processing the metal-oxide-semiconductor thin film |
703

| |
|---|
| Forming a thin film containing a lanthanide element on the base substrate including the active layer |
704

| |
|---|
| Annealing the active layer and the thin film containing the lanthanide element, such that the lanthanide element in the thin film containing the lanthanide element is diffused into the active layer |
705

| |
|---|
| Removing the thin film containing the lanthanide element |
706

| |
|---|
| Forming a gate insulation structure on the active layer |
707

| |
|---|
| Forming a gate is formed on the gate insulation structure |
708

FIG. 29

METAL-OXIDE THIN-FILM TRANSISTOR AND METHOD FOR MANUFACTURING SAME, X-RAY DETECTOR, AND DISPLAY PANEL

CROSS-REFERENCE TO RELATED APPLICATION

This application is a 371 of PCT application No. PCT/CN2021/125799, filed on Oct. 22, 2021, which claims priority to Chinese Patent Application No. 202110276323.3 filed on Mar. 15, 2021 and entitled "METAL-OXIDE THIN-FILM TRANSISTOR AND METHOD FOR MANUFACTURING SAME, X-RAY DETECTOR, AND DISPLAY PANEL," and the disclosures of which are herein incorporated by reference in their entireties.

TECHNICAL FIELD

The present disclosure relates to the field of electronic technologies, and in particular, relates to a metal-oxide thin-film transistor and a method for manufacturing the same, an x-ray detector, and a display panel.

BACKGROUND

Metal-oxide thin-film transistors (TFT) are devices achievable a switch function.

SUMMARY

Embodiments of the present disclosure provide a metal-oxide TFT and a method for manufacturing the same, an x-ray detector, and a display panel. The technical solutions are as follows.

In one aspect of the present disclosure, a method for manufacturing a metal-oxide TFT is provided. The method includes:

forming, on a base substrate, an active layer including a metal oxide semiconductor, and a functional layer laminated on the active layer and containing a lanthanide element; and annealing the active layer and the functional layer, such that the lanthanide element in the functional layer is diffused into the active layer.

Optionally, the annealing is carried out at a temperature ranging from 200 to 450° C., for a time duration ranging from 0.5 to 3 h, and in an atmosphere containing dry air or oxygen.

Optionally, forming, on the base substrate, the active layer including the metal oxide semiconductor, and the functional layer laminated on the active layer and containing the lanthanide element includes:

successively forming a metal-oxide-semiconductor thin film and a thin film containing the lanthanide element on the base substrate;

forming a first photoresist pattern on the thin film containing the lanthanide element;

forming the active layer and the functional layer laminated on the active layer by etching the metal-oxide-semiconductor thin film and the thin film containing the lanthanide element using a same etching solution; and removing the first photoresist pattern.

Optionally, removing the functional layer.

Optionally, removing the functional layer includes:

forming a source-drain electrode metal layer on the base substrate including the functional layer;

forming a second photoresist pattern on the source-drain electrode metal layer; and etching the source-drain electrode metal layer and the functional layer, such that the source-drain electrode metal layer forms a source-drain electrode, and a portion, outside a first region, of the functional layer is etched, wherein the first region is an orthographic projection region of the source-drain electrode on the active layer, and the source-drain electrode includes a source electrode and a drain electrode.

Optionally, forming, on the base substrate, the active layer including the metal oxide semiconductor and the functional layer laminated on the active layer and containing the lanthanide element includes:

forming the active layer on the base substrate;

forming a thin film containing the lanthanide element on the base substrate including the active layer, wherein the active layer is defined by a top face, a bottom face, and a side face connected between the top face and the bottom face, the bottom face facing towards the base substrate, and the thin film containing the lanthanide element covering the top face and the side face of the active layer;

annealing the active layer and the functional layer includes:

annealing the active layer and the thin film containing the lanthanide element, such that the lanthanide element is diffused from the thin film containing the lanthanide element into the top face and the side face of the active layer.

Optionally, a material of the functional layer includes a single-metal oxide or a multi-metal oxide containing the lanthanide element.

Optionally, a material of the functional layer includes one or more of a praseodymium oxide, a samarium oxide, a cerium oxide, an indium-zinc oxide, an indium-zinc-praseodymium oxide, and an indium-zinc-samarium oxide.

In another aspect, a metal-oxide thin-film transistor (TFT) is provided. The metal-oxide TFT is manufactured by the method in any one of above aspect. The metal-oxide TFT includes:

an active layer, on a base substrate, including a metal oxide semiconductor, wherein the active layer contains a lanthanide element.

Optionally, the lanthanide element is diffused into a material at a specified depth of a face, distal from the base substrate, of the active layer.

Optionally, the active layer is a single layer and a channel layer of the TFT, and is defined by a top face, a bottom face, and a side face connected between the top face and the bottom face, and the face, distal from the base substrate, of the active layer includes the top face and the side face of the active layer.

Optionally, a mass percentage of the lanthanide element in the active layer decreases in a direction facing towards the base substrate.

Optionally, the lanthanide element includes one or more of praseodymium, samarium, and cerium.

Optionally, the specified depth is less than or equal to 10 nm.

Optionally, the metal-oxide TFT further includes a source-drain electrode, and a metal layer disposed between the active layer and the source-drain electrode and containing the lanthanide element, wherein the source-drain electrode includes a source electrode and a drain electrode, and a material of the metal layer includes a single-metal oxide or a multi-metal oxide containing the lanthanide element.

Optionally, the mass percentage of the lanthanide element in the active layer is greater than or equal to 0.5%, and is less than or equal to 10%.

In another aspect, an x-ray detector is provided. The x-ray detector includes the metal-oxide TFT in any one of above aspects.

In another aspect, a display panel is provided. The display panel includes the metal-oxide TFT in any one of above aspects.

In another aspect, a metal-oxide thin-film transistor (TFT) is provided. The metal-oxide TFT is manufactured by the method in any one of above aspect. The metal-oxide TFT includes:

a gate, a source electrode, a drain electrode, and an active layer that are disposed on a base substrate; wherein the active layer is disposed between the gate and the source electrode or the drain electrode; and the active layer includes a channel layer, wherein the channel layer is a first metal oxide semiconductor layer; the first metal oxide semiconductor layer including one or more of indium, gallium, zinc, tin, aluminum, tungsten, zirconium, hafnium, silicon; and a material doped with a lanthanide element is present in the channel layer;

the material doped with a lanthanide element is present in an upper face of the channel layer and a position with a thickness from the upper face, and a content of the lanthanide element decreases in a direction away from the upper face of the channel layer.

Optionally, the source electrode and the drain electrode are disposed on the active layer;

a metal layer is disposed between the channel layer of the active layer and the source electrode, wherein the metal layer contains a lanthanide element that is the same as the lanthanide element in the material doped with the lanthanide element; and a metal layer is disposed between the channel layer of the active layer and the drain electrode, wherein the metal layer contains a lanthanide element that is the same as the lanthanide element in the material doped with the lanthanide element.

Optionally, a thickness of the metal layer between the source electrode and the channel layer is equal to a thickness of the metal layer between the drain electrode and the channel layer.

Optionally, an outer sidewall of the metal layer between the source electrode and the channel layer and one outer sidewall of the channel layer are disposed on a same slope face, and have a same slope angle direction; and an outer sidewall of the metal layer between the drain electrode and the channel layer and another outer sidewall of the channel layer are disposed on a same slope face, and have a same slope angle direction; and an inner sidewall of the metal layer between the source electrode and the channel layer and an inner sidewall of the source electrode are disposed on a same slope face, and have a same slope angle direction; and an inner sidewall of the metal layer between the drain electrode and the channel layer and an inner sidewall of the drain electrode are disposed on a same slope face, and have a same slope angle direction.

Optionally, the active layer further includes a back channel protective layer, the channel layer includes an indium-gallium-tin oxide doped with the lanthanide element, wherein the back channel protective layer is disposed on the channel layer, and the back channel protective layer includes a crystalline indium-gallium-zinc oxide, an indium-zinc oxide doped with the lanthanide element, or an indium-gallium-zinc oxide doped with the lanthanide element.

Optionally, the active layer further includes a light blocking protective layer, wherein the light blocking protective layer includes the indium-zinc oxide doped with the lanthanide element or the indium-gallium-zinc oxide doped with the lanthanide element, and the light blocking protective layer is disposed on a side, distal from the back channel protective layer, of the channel layer.

Optionally, the lanthanide element is praseodymium.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 1 is a flowchart of a method for manufacturing a metal-oxide TFT according to an embodiment of the present disclosure;

FIG. 2 is a flowchart of another method for manufacturing a metal-oxide TFT according to an embodiment of the present disclosure;

FIG. 3 is a schematic diagram of a structure of the base substrate in the method shown in FIG. 2;

FIG. 4 is a schematic diagram of another structure of the base substrate in the method shown in FIG. 2;

FIG. 5 is a schematic diagram of another structure of the base substrate in the method shown in FIG. 2;

FIG. 14 is a flowchart of another method for manufacturing a metal-oxide TFT according to an embodiment of the present disclosure;

FIG. 15 is a schematic diagram of another structure of the base substrate in the method shown in FIG. 14;

FIG. 21 is a schematic diagram of another structure of the base substrate in the method shown in FIG. 14;

FIG. 22 is a flowchart of another method for manufacturing a metal-oxide TFT according to an embodiment of the present disclosure;

FIG. 28 is a schematic diagram of another structure of the base substrate in the method shown in FIG. 22;

FIG. 29 is a flowchart of another method for manufacturing a metal-oxide TFT according to an embodiment of the present disclosure;

Figure 6:
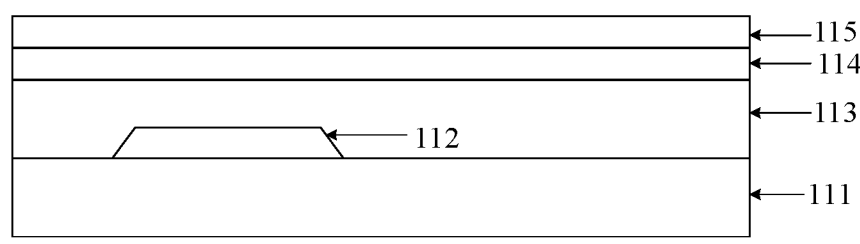
FIG. 6 is a schematic diagram of another structure of the base substrate in the method shown in FIG. 2.

The embodiments of the present disclosure are shown by above accompanying drawings, and clearer description is given hereinafter. The accompanying drawings and description are not intended to limit the scope of the concept of the present disclosure in any means, but illustrate the concept of the present disclosure with reference to specific embodiments.

DETAILED DESCRIPTION

For clearer descriptions of the objectives, technical solutions, and advantages in the present disclosure, the embodiments of the present disclosure are described in detail hereinafter in combination with the accompanying drawings.

A metal-oxide TFT is a novelty TFT, and is applicable to a liquid crystal display (LCD), an organic light-emitting diode (OLED) display, an x-ray transducer, a mini LED display, a quantum dot light emitting diode (QLED) display, a low temperature polycrystalline oxide (LTPO) technologies, and the like.

The metal-oxide TFT, in applying to a display panel, may be disposed in an array substrate. The array substrate is a member of the display panel, and is configured to control the display panel. The display panel may include other members according to various types of the display panels. For example, the display panel may include a liquid crystal layer and a color film substrate in the case that the display panel is a liquid crystal display panel, and the display panel may include an organic light-emitting diode in the case that the display panel is an organic light-emitting diode display panel.

The array substrate may include a base substrate and a plurality of thin film transistors arranged in an array on the base substrate. The thin film transistor may include a gate, a source electrode, a drain electrode, and an active layer, the source electrode and the drain electrode are connected to the active layer, and whether the source electrode and the drain electrode are conducted may be controlled by voltages supplied to the gate, such that the function of the thin film transistor may be achieved.

In the related art, there is a method for manufacturing the metal-oxide TFT, and the method includes forming an active layer through a metal oxide semiconductor material.

However, the stability of the active layer of the metal-oxide TFT manufactured by above method is poor.

FIG. 1 is a flowchart of a method for manufacturing a metal-oxide TFT according to an embodiment of the present disclosure. The method may include the following processes.

In S201, an active layer including a metal oxide semiconductor and a functional layer laminated on the active layer and containing a lanthanide element are formed on a base substrate.

In S202, the active layer and the functional layer are annealed, such that the lanthanide element in the functional layer is diffused into the active layer.

In summary, a method for manufacturing a metal-oxide TFT is provided in the embodiments of the present disclosure. In the method, after the active layer including the metal oxide semiconductor and the functional layer laminated on the active layer and containing the lanthanide element are formed on the base substrate, the active layer and the functional layer are annealed, such that the lanthanide element in the functional layer is diffused into the active layer. The lanthanide element diffused into the active layer may form a trap state in the active layer, and photo-generated electrons generated after the active layer is lighted may be captured by the trap state. Therefore, the illuminance stability of the active layer is improved, a problem of poor light stability of the active layer of the metal-oxide TFT in the related art may be solved, and an effect of light stability of the active layer of the metal-oxide TFT may be improved.

FIG. 2 is a flowchart of another method for manufacturing a metal-oxide TFT according to an embodiment of the present disclosure. The method may include the following processes.

In S301, a base substrate is acquired.

A material of the base substrate may include glass, polyimides, or the like.

In S302, a gate is formed on the base substrate.

The gate may be a portion in the thin film transistor. In the case that the gate is formed, a gate metal layer may be formed on the base substrate first (the gate metal layer may be formed in one of deposition, sputtering, and the like), and then a patterning process may be performed on the gate metal layer to acquire the gate. It is noted that, a gate pattern including a plurality of the gates may be acquired by the patterning process, and part or all of the gates in the gate pattern may be referred to the gate in the embodiments of the present disclosure. In the embodiments of the present disclosure, the patterning process may include photoresist coating, exposing, developing, etching, photoresist removing, and the like.

Illustratively, as shown in FIG. 3, FIG. 3 is a schematic diagram of a structure of the base substrate after S302 is performed. The gate 112 is formed on the base substrate 111, and a material of the gate 112 may include a metal.

In S303, a gate insulation layer is formed on the gate pattern.

The gate insulation layer may be configured to avoid shorting the gate to other structures in the TFT.

Illustratively, as shown in FIG. 4, FIG. 4 is a schematic diagram of another structure of the base substrate after S303 is performed. The gate insulation layer 113 is formed on the base substrate 111 including the gate 112, and a material of the gate insulation layer 113 may include silicon dioxide, silicon nitride, or a mixture of the silicon dioxide and silicon nitride.

In S304, an active layer including a metal oxide semiconductor and a functional layer laminated on the active layer and containing a lanthanide element are formed on the gate insulation layer.

As shown in FIG. 5, S304 may include the following four sub-steps.

In sub-step 3041, a metal-oxide-semiconductor thin film and a thin film containing the lanthanide element are successively formed on the gate insulation layer.

Both the metal-oxide-semiconductor thin film and the thin film containing the lanthanide element are an entire layer structures, and are successively covered on the gate insulation layer. The metal-oxide-semiconductor thin film and the thin film containing the lanthanide element may be formed by depositing.

A material of the metal-oxide-semiconductor thin film may include an indium-zinc oxide (IZO), an indium-gallium oxide (IGO), an indium-gallium-zinc oxide (IGZO), an indium-gallium-tin oxide (IGTO), an indium-tin-zinc oxide (ITZO), or a single-metal oxide or a multi-metal oxide containing indium (In), gallium (Ga), zinc (Zn), stannum (Sn), aluminum (Al), wolfram (W), zirconium (Zr), hafnium (Hf), and silicon (Si).

Illustratively, as shown in FIG. 6, FIG. 6 is a schematic diagram of another structure of the base substrate after S3041 is performed. The metal-oxide-semiconductor thin film 114 and the thin film 114 including the lanthanide element are formed on the base substrate 111 including the gate insulation layer 113.

In sub-step 3042, a first photoresist pattern is formed on the thin film containing the lanthanide element.

Forming the first photoresist pattern may include: forming a film layer of the photoresist on the thin film containing the lanthanide element, and exposing and developing the film layer of the photoresist, so as to form the first photoresist pattern.

The photoresist, also referred to as a photo resist, is a bearing media for lithography imaging, and is used to convert diffracted and filtered light information in a lithography system to chemistry energy based on the principle of photochemical reaction, so as to copy a mask pattern.

In sub-step 3043, the active layer and the functional layer laminated on the active layer are formed by etching the metal-oxide-semiconductor thin film and the thin film containing the lanthanide element using a same etching solution.

In the embodiments of the present disclosure, the active layer and the functional layer laminated on the active layer may be formed by etching the metal-oxide-semiconductor thin film and the thin film containing the lanthanide element using a same etching solution.

The active layer and the functional layer laminated on the active layer are formed by one patterning process.

A material of the functional layer may include a single-metal oxide or a multi-metal oxide containing praseodymium, samarium, cerium, and other lanthanide elements. For example, the material of the functional layer may include one or more of a praseodymium oxide, a samarium oxide, a cerium oxide, an indium-zinc oxide, an indium-zinc-praseodymium oxide, and an indium-zinc-samarium oxide.

Figure 7:
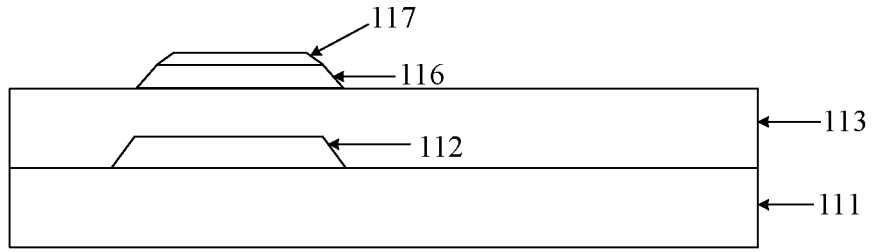
FIG. 7 is a schematic diagram of another structure of the base substrate in the method shown in FIG. 2.

Illustratively, as shown in FIG. 7, FIG. 7 is a schematic diagram of another structure of the base substrate after S3041 is performed. The active layer 116 and the functional layer 117 are acquired by processing the metal-oxide-semiconductor thin film and the thin film containing the lanthanide element.

In sub-step 3044, the first photoresist pattern is removed.

The first photoresist pattern may be removed by peeling.

In S305, the active layer and the functional layer are annealed, such that the lanthanide element in the functional layer is diffused into the active layer.

The active layer and the functional layer are annealed, such that the lanthanide element in the functional layer is diffused into the active layer, and the active layer may have a great corrosion resistance property.

The anneal is a thermal treatment process for metals. In annealing, the metal may be heated to a specified temperature, the temperature may be held for a time duration, and then the metal is cooled at an appropriate rate. In the embodiments of the present disclosure, the annealing is carried out at a temperature ranging from 200 to 450° C., for a time duration ranging from 0.5 to 3 h, and in an atmosphere containing dry air or oxygen.

The effect of nitrogen or water vapors on the anneal may be avoided by annealing in the atmosphere including dry air or oxygen.

In annealing, the lanthanide element in the functional layer may be diffused into a surface of the active layer. The lanthanide element diffused into the active layer may form a trap state in the active layer, and photo-generated electrons generated after the active layer is lighted may be captured by the trap state, such that a number of photo-generated electrons is reduced, and light stability of the active layer is further improved.

The photo-generated electrons are electrons in the valance band that enter into the conduction band in the case that the light is irradiated to the semiconductor and energy of photons is greater than or equal to the stop band width of the semiconductor, such that photo-generated electron-hole pairs are generated.

The stop band width determines that the material is of semiconductor properties or insulator properties. The stop band width of the semiconductor is less, and electrons may be excited to a conduction band in the case that the temperature is increased, such that the material possesses a conductivity. The stop band width of the insulator is greater, and the material is still a poor conductor of electricity even in higher temperature.

In annealing, a thickness of the lanthanide element in the functional layer diffusing into the surface of the active layer may be less than or equal to 10 nm, or, a thickness of the lanthanide element in the functional layer diffusing into the surface of the active layer may be less than or equal to 5 nm. A mass percentage of the lanthanide element in the active layer is greater than or equal to 0.5%, and is less than or equal to 10%. In the range, the lanthanide element diffused into the active layer may improve the light stability of the active layer.

Figure 8:
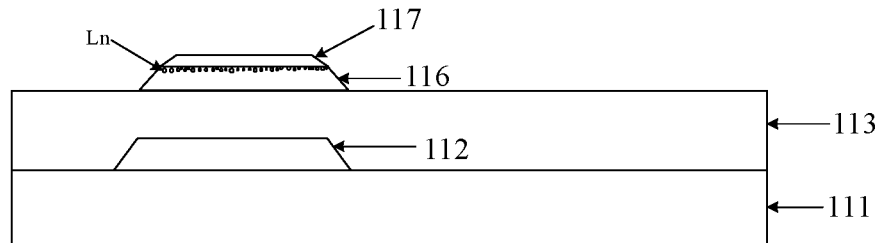
FIG. 8 is a schematic diagram of another structure of the base substrate in the method shown in FIG. 2.

Illustratively, as shown in FIG. 8, FIG. 8 is a schematic diagram of another structure of the base substrate after S305 is performed. The active layer 116 and the functional layer 117 are annealed, such that the lanthanide element Ln in the functional layer 117 is diffused into a side face, distal from the base substrate, of the active layer.

In S306, the functional layer is removed.

In the embodiments of the present disclosure, the functional layer on the active layer may be removed by etching. As the annealed active layer possesses the great corrosion resistance property, the active layer may be protected from damaging in etching the functional layer.

The etch may be a dry etch or a wet etch.

Figure 9:
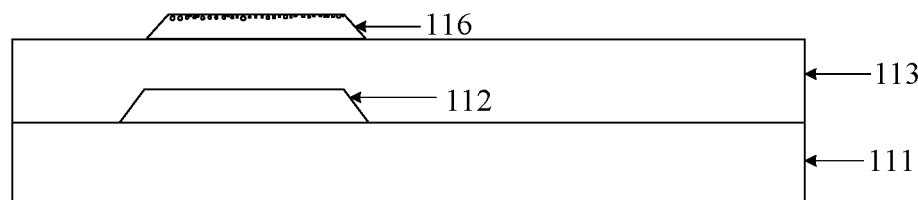
FIG. 9 is a schematic diagram of another structure of the base substrate in the method shown in FIG. 2.

As shown in FIG. 9, FIG. 9 is a schematic diagram of another structure of the base substrate after S306 is performed. After the entire functional layer is etched, the active layer with the great corrosion resistance property is remained.

In S307, a source electrode and a drain electrode are formed on the active layer.

After the functional layer is removed, the source electrode and the drain electrode are formed on the active layer, such that a contact area of the source electrode and the drain electrode with the active layer is increased, and the property of the metal-oxide TFT is increased.

Forming the source electrode and the drain electrode may include: forming a source-drain electrode metal layer on the base substrate including the active layer, and forming a second photoresist pattern on the source-drain electrode metal layer; and etching the source-drain electrode metal layer, such that the source-drain electrode metal layer forms the source electrode and the drain electrode.

Figure 10:
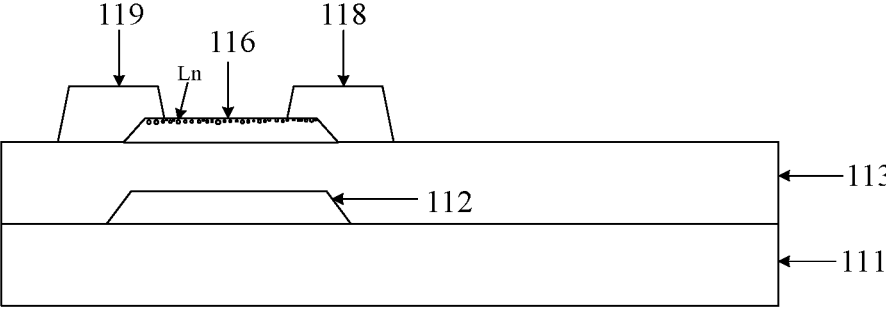
FIG. 10 is a schematic diagram of another structure of the base substrate in the method shown in FIG. 2.

Illustratively, as shown in FIG. 10, FIG. 10 is a schematic diagram of another structure of the base substrate after S307 is performed. The source-drain electrode metal layer is formed on the base substrate 111 including the active layer 116, and the source electrode 118 and the drain electrode 119 are formed by performing one patterning process on the source-drain electrode metal layer.

In summary, a method for manufacturing a metal-oxide TFT is provided in the embodiments of the present disclosure. In the method, after the active layer including the metal oxide semiconductor and the functional layer laminated on the active layer and containing the lanthanide element are formed on the base substrate, the active layer and the functional layer are annealed, such that the lanthanide element in the functional layer is diffused into the active layer. The lanthanide element diffused into the active layer may form a trap state in the active layer, and photo-generated electrons generated after the active layer is lighted may be captured by the trap state. Therefore, the illuminance stability of the active layer is improved, a problem of poor light stability of the active layer of the metal-oxide TFT in the related art may be solved, and an effect of light stability of the active layer of the metal-oxide TFT may be improved.

Figure 11:
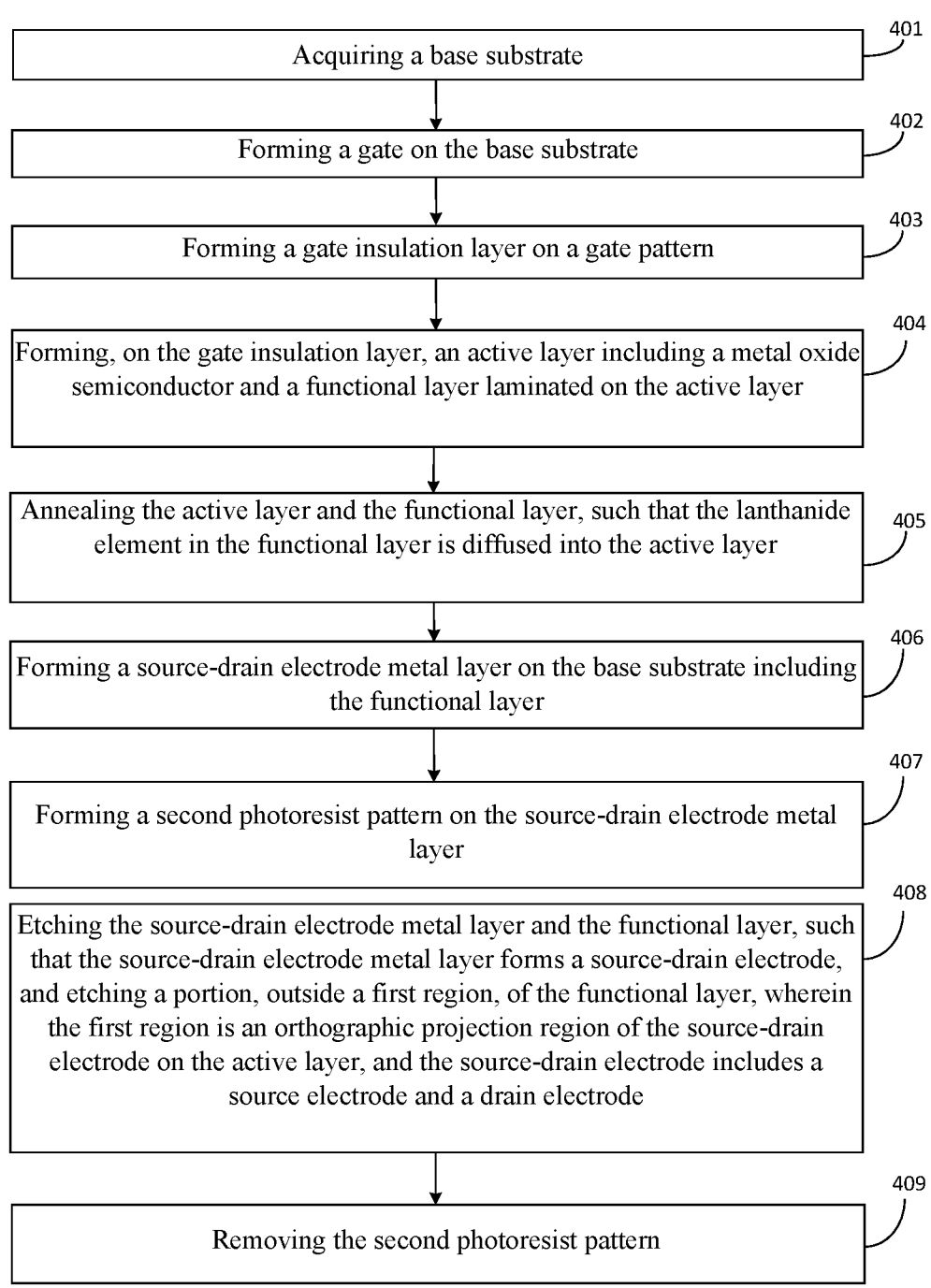
FIG. 11 is a flowchart of another method for manufacturing a metal-oxide TFT according to an embodiment of the present disclosure.

FIG. 11 is a flowchart of another method for manufacturing a metal-oxide TFT according to an embodiment of the present disclosure. The method may include the following processes.

In S401, a base substrate is acquired.

In S402, a gate is formed on the base substrate.

S402 may be referred to S302 in the embodiments of FIG. 2, which is not limited in the embodiments of the present disclosure. After S402 is performed, the structure of the base substrate may be referred to FIG. 3.

In S403, a gate insulation layer is formed on the gate pattern.

S403 may be referred to S303 in the embodiments of FIG. 2, which is not limited in the embodiments of the present disclosure. After S403 is performed, the structure of the base substrate may be referred to FIG. 4.

In S404, an active layer including a metal oxide semiconductor and a functional layer laminated on the active layer are formed on the gate insulation layer.

S404 may be referred to S304 in the embodiments of FIG. 2, which is not limited in the embodiments of the present disclosure. After S404 is performed, the structure of the base substrate may be referred to FIG. 7.

In S405, the active layer and the functional layer are annealed, such that the lanthanide element in the functional layer is diffused into the active layer.

S405 may be referred to S305 in the embodiments of FIG. 2, which is not limited in the embodiments of the present disclosure. After S405 is performed, the structure of the base substrate may be referred to FIG. 8.

In S406, a source-drain electrode metal layer is formed on the base substrate including the functional layer.

The source-drain electrode metal layer is formed on the base substrate including the functional layer.

Figure 12:
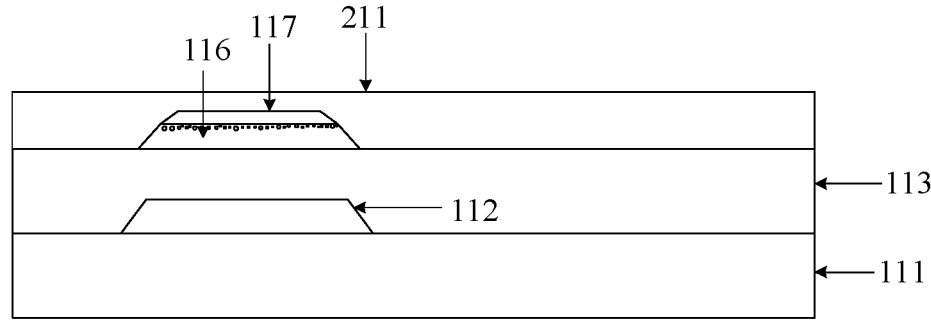
FIG. 12 is a schematic diagram of another structure of the base substrate in the method shown in FIG. 11.

Illustratively, as shown in FIG. 12, FIG. 12 is a schematic diagram of another structure of the base substrate after S306 is performed. The source-drain electrode metal layer 211 is formed on the base substrate 111 including the functional layer 117.

In S407, a second photoresist pattern is formed on the source-drain electrode metal layer.

The process of forming the second photoresist pattern may be referred to the process of forming the first photoresist pattern in above embodiments, which is not limited in the embodiments of the present disclosure.

In S408, the source-drain electrode metal layer and the functional layer are etched, such that the source-drain electrode metal layer forms a source-drain electrode, and a portion, outside a first region, of the functional layer is etched, wherein the first region is an orthographic projection region of the source-drain electrode on the active layer, and the source-drain electrode includes a source electrode and a drain electrode.

In this step, the source-drain electrode metal layer and the functional layer are etched using a same etching solution, such that the source-drain electrode metal layer forms the source-drain electrode. Therefore, in the case that the source-drain electrode is formed by one patterning process, part of the functional layer is removed, such that the effect of the functional layer on the active layer is reduced. The etch includes the dry etch and the wet etch. The first region is the orthographic projection region of the source-drain electrode on the active layer, such that the active layer may be protected from damaging in etching the functional layer.

Figure 13:
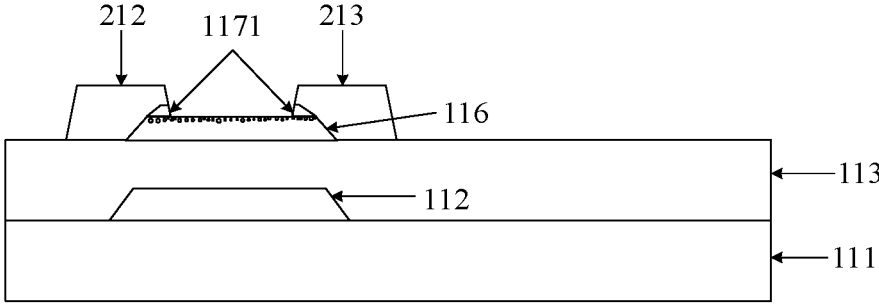
FIG. 13 is a schematic diagram of another structure of the base substrate in the method shown in FIG. 11.

As shown in FIG. 13, FIG. 13 is a schematic diagram of another structure of the base substrate after S308 is performed. The source electrode 212 and the drain electrode 213 are formed by performing one patterning process on source-drain electrode metal layer 211.

The portion, outside the first region, of the functional layer is etched, such that the portion, outside the first region, of the functional layer is removed. In this case, a metal layer 1171 including the lanthanide element may be present between the active layer 116 and the source-drain electrode.

The source-drain electrode metal layer is formed on the functional layer, and the source-drain electrode metal layer and the functional layer are processed, such that forming the source-drain electrode and removing the functional layer may be achieved in one process, and the manufacturing process of the metal-oxide TFT may be saved.

In S409, the second photoresist pattern is removed.

In summary, a method for manufacturing a metal-oxide TFT is provided in the embodiments of the present disclosure. In the method, after the active layer including the metal oxide semiconductor and the functional layer laminated on the active layer and containing the lanthanide element are formed on the base substrate, the active layer and the functional layer are annealed, such that the lanthanide element in the functional layer is diffused into the active layer. The lanthanide element diffused into the active layer may form a trap state in the active layer, and photo-generated electrons generated after the active layer is lighted may be captured by the trap state. Therefore, the illuminance stability of the active layer is improved, a problem of poor light stability of the active layer of the metal-oxide TFT in the related art may be solved, and an effect of light stability of the active layer of the metal-oxide TFT may be improved.

FIG. 14 is a flowchart of another method for manufacturing a metal-oxide TFT according to an embodiment of the present disclosure. The method may include the following processes.

In S501, a base substrate is acquired.

In S502, a gate is formed on the base substrate.

S502 may be referred to S302 in the embodiments of FIG. 2, which is not limited in the embodiments of the present disclosure. After S502 is performed, the structure of the base substrate may be referred to FIG. 3.

In S503, a gate insulation layer is formed on the gate pattern.

S503 may be referred to S303 in the embodiments of FIG. 2, which is not limited in the embodiments of the present disclosure. After S503 is performed, the structure of the base substrate may be referred to FIG. 4.

In S504, an active layer including a metal oxide semiconductor is formed on the gate insulation layer.

The active layer is formed on the base substrate including the gate insulation layer. A metal-oxide-semiconductor thin film may be formed on the gate insulation layer, and a forth photoresist pattern may be formed on the metal-oxide-semiconductor thin film. The metal-oxide-semiconductor thin film is etched using an etching solution to form the active layer, and the forth photoresist pattern is removed.

As shown in FIG. 15, S504 may include the following four sub-steps.

In sub-step S041, a metal-oxide-semiconductor thin film is formed on the gate insulation layer.

The metal-oxide-semiconductor thin film is an entire layer structure, and is covered on the gate insulation layer. The metal-oxide-semiconductor thin film may be formed by depositing.

Figure 16:
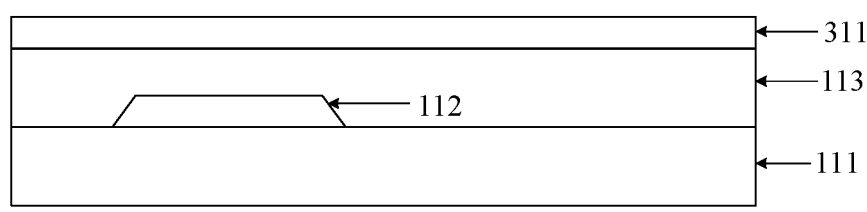
FIG. 16 is a schematic diagram of another structure of the base substrate in the method shown in FIG. 14.

Illustratively, as shown in FIG. 16, FIG. 16 is a schematic diagram of another structure of the base substrate after S5041 is performed. The metal-oxide-semiconductor thin film 311 is formed on the base substrate 111 including the gate insulation layer 113.

In sub-step S042, the active layer is acquired by processing the metal-oxide-semiconductor thin film.

The material of the active layer may be referred to the material of the active layer in the embodiment of FIG. 2.

Figure 17:
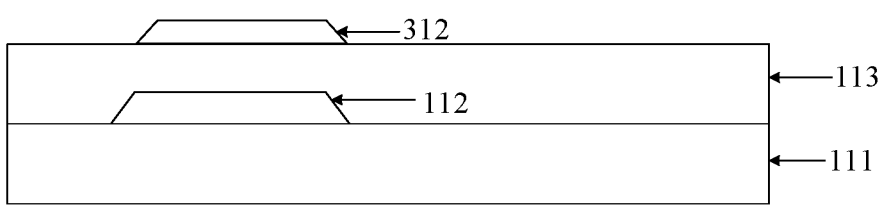
FIG. 17 is a schematic diagram of another structure of the base substrate in the method shown in FIG. 14.

Illustratively, as shown in FIG. 17, FIG. 17 is a schematic diagram of another structure of the base substrate after S5042 is performed. The active layer 312 is acquired by processing the metal-oxide-semiconductor thin film with one patterning process. The active layer 312 is defined by a top face, a bottom face, and a side face connected between the top face and the bottom face, and the bottom face faces towards the base substrate 111.

In S505, a thin film containing the lanthanide element is formed on the base substrate including the active layer.

A material of the thin film containing the lanthanide element may include a single-metal oxide or a multi-metal oxide containing praseodymium, samarium, cerium, and other lanthanide elements. The thin film containing the lanthanide element is formed on the base substrate including the active layer, and the thin film includes the functional layer. The material of the thin film containing the lanthanide element may include one or more of a praseodymium oxide, a samarium oxide, a cerium oxide, an indium-zinc oxide, an indium-zinc-praseodymium oxide, and an indium-zinc-samarium oxide.

Figure 18:
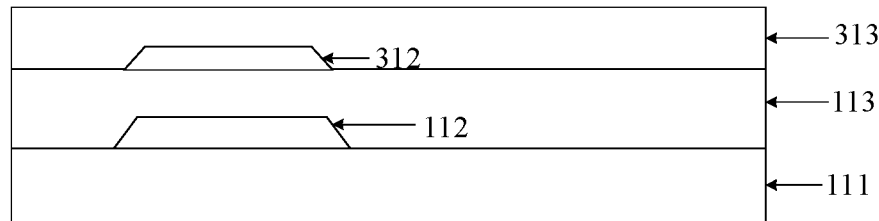
FIG. 18 is a schematic diagram of another structure of the base substrate in the method shown in FIG. 14.

Illustratively, as shown in FIG. 18, FIG. 18 is a schematic diagram of another structure of the base substrate after S505 is performed. The thin film 313 including the lanthanide element is formed on the base substrate 111 including the active layer 312, and the thin film 313 including the lanthanide element covers the top face and side face of the active layer 312.

In S506, the active layer and the thin film containing the lanthanide element are annealed, such that the lanthanide element is diffused from the thin film containing the lanthanide element into the top face and the side face of the active layer.

The active layer and the thin film containing the lanthanide element are annealed, and the etching process may be referred to the etching process in the embodiments of FIG. 2.

The thin film containing the lanthanide element covers the top face and side face of the active layer, such that the lanthanide element in the thin film containing the lanthanide element may be diffused into the top face and the side face of the active layer, and the light stability of the side face of the active layer may be improved.

Figure 19:
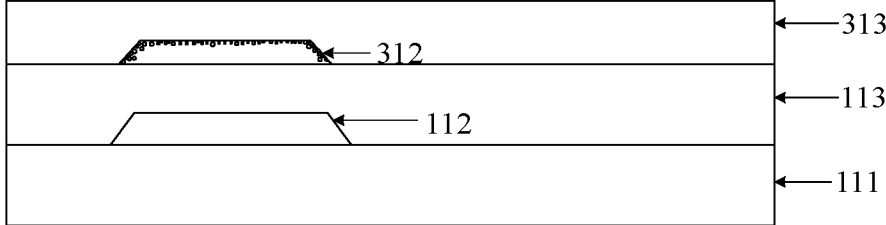
FIG. 19 is a schematic diagram of another structure of the base substrate in the method shown in FIG. 14.

As shown in FIG. 19, FIG. 19 is a schematic diagram of another structure of the base substrate after S506 is performed. The active layer and the thin film 313 including the lanthanide element are annealed, such that the lanthanide element in the thin film 313 including the lanthanide element may be diffused into the active layer 312.

In S507, the thin film containing the lanthanide element is removed.

Removing the thin film containing the lanthanide element may include etching the entire thin film containing the lanthanide element.

Figure 20:
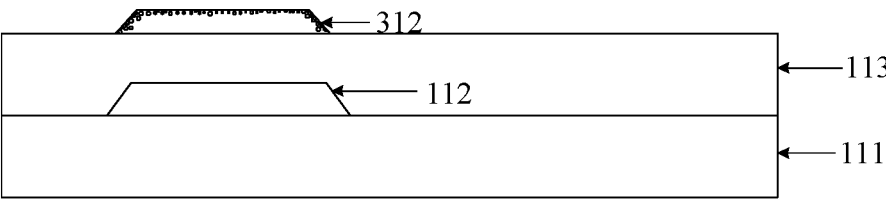
FIG. 20 is a schematic diagram of another structure of the base substrate in the method shown in FIG. 14.

As shown in FIG. 20, FIG. 20 is a schematic diagram of another structure of the base substrate after S507 is performed. The entire thin film containing the lanthanide element is etched, and the active layer with the great corrosion resistance property is remained.

In S508, the source electrode and the drain electrode are formed on the active layer.

S508 may be referred to S307 in the embodiments of FIG. 2, which is not limited in the embodiments of the present disclosure.

Illustratively, as shown in FIG. 21, FIG. 21 is a schematic diagram of another structure of the base substrate after S508 is performed. The source-drain electrode metal layer is formed on the base substrate 111 including the active layer 312, and the source electrode 118 and the drain electrode 119 are formed by performing one patterning process on the source-drain electrode metal layer.

In summary, a method for manufacturing a metal-oxide TFT is provided in the embodiments of the present disclosure. In the method, after the active layer including the metal oxide semiconductor and the functional layer laminated on the active layer and containing the lanthanide element are formed on the base substrate, the active layer and the functional layer are annealed, such that the lanthanide element in the functional layer is diffused into the active layer. The lanthanide element diffused into the active layer may form a trap state in the active layer, and photo-generated electrons generated after the active layer is lighted may be captured by the trap state. Therefore, the illuminance stability of the active layer is improved, a problem of poor light stability of the active layer of the metal-oxide TFT in the related art may be solved, and an effect of light stability of the active layer of the metal-oxide TFT may be improved.

FIG. 22 is a flowchart of another method for manufacturing a metal-oxide TFT according to an embodiment of the present disclosure. The method may include the following processes.

In S601, a base substrate is acquired.

In S602, a buffer layer, a metal-oxide-semiconductor thin film, and a thin film containing the lanthanide element are successively formed on the base substrate.

The buffer layer, the metal-oxide-semiconductor thin film, and both the thin film containing the lanthanide element are entire layer structures, and are successively covered on the base substrate. The buffer layer may be formed by a silicon nitride material, and the buffer layer, the metal-oxide-semiconductor thin film, and the thin film containing the lanthanide element may be formed by depositing.

Figure 23:
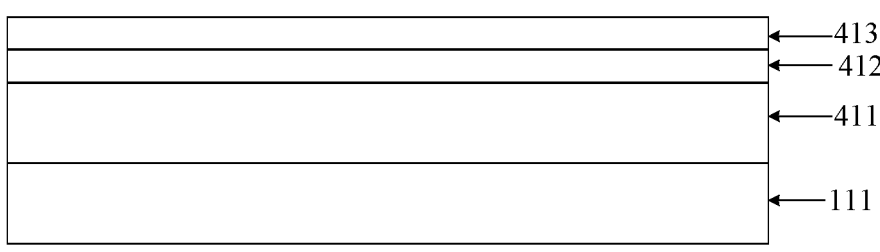
FIG. 23 is a schematic diagram of another structure of the base substrate in the method shown in FIG. 22.

Illustratively, as shown in FIG. 23, FIG. 23 is a schematic diagram of another structure of the base substrate after S602 is performed. The buffer layer 411, the metal-oxide-semiconductor thin film 412, and the thin film 413 including the lanthanide element are successively formed on the base substrate.

In S603, the active layer and the functional layer are acquired by processing the metal-oxide-semiconductor thin film and the thin film containing the lanthanide element.

S603 may be referred to the sub-steps 3042, 3043, and 3044 in the embodiments of FIG. 2, which is not limited in the embodiments of the present disclosure.

Figure 24:
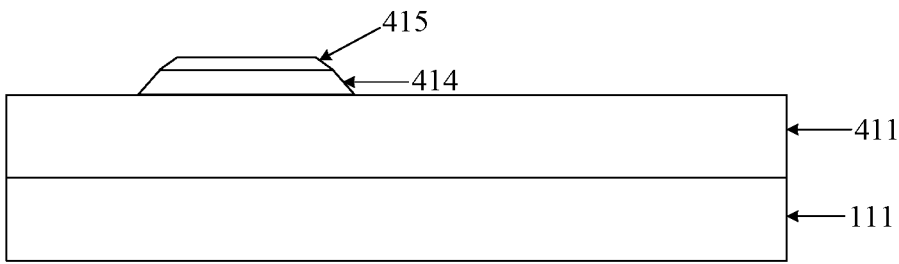
FIG. 24 is a schematic diagram of another structure of the base substrate in the method shown in FIG. 22.

Illustratively, as shown in FIG. 24, FIG. 24 is a schematic diagram of another structure of the base substrate after S603 is performed. The active layer and the functional layer are acquired by performing one patterning process on the metal-oxide-semiconductor thin film and the thin film containing the lanthanide element.

In S604, the active layer and the functional layer are annealed, such that the lanthanide element in the functional layer is diffused into the active layer.

S604 may be referred to S305 in the embodiments of FIG. 2, which is not limited in the embodiments of the present disclosure.

Figure 25:
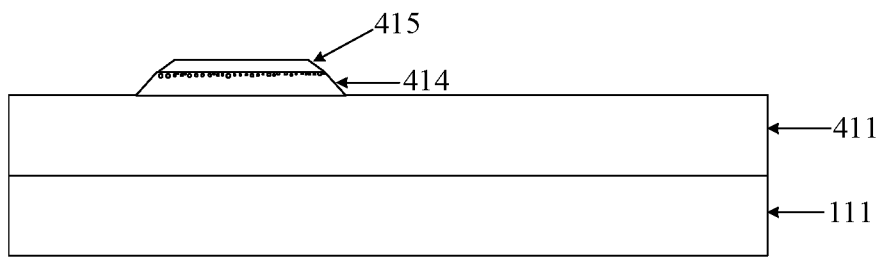
FIG. 25 is a schematic diagram of another structure of the base substrate in the method shown in FIG. 22.

Illustratively, as shown in FIG. 25, FIG. 25 is a schematic diagram of another structure of the base substrate after S604 is performed. The active layer and the functional layer 415 are annealed, such that the lanthanide element in the functional layer 415 is diffused into the active layer 414.

In S605, the functional layer is removed.

S605 may be referred to S306 in the embodiments of FIG. 2, which is not limited in the embodiments of the present disclosure.

Figure 26:
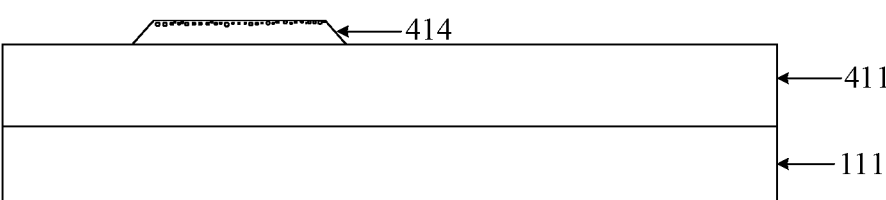
FIG. 26 is a schematic diagram of another structure of the base substrate in the method shown in FIG. 22.

Illustratively, as shown in FIG. 26, FIG. 26 is a schematic diagram of another structure of the base substrate after S605 is performed. The entire functional layer is etched, and the active layer 414 with the great corrosion resistance property is remained.

In S606, a gate insulation structure is formed on the active layer.

A material of the gate insulation structure may be silicon dioxide, silicon nitride, or a mixture of the silicon dioxide and silicon nitride. A gate insulation material layer may be formed on the active layer by depositing, and the gate insulation structure may be formed by performing one patterning process on the gate insulation material layer.

Figure 27:
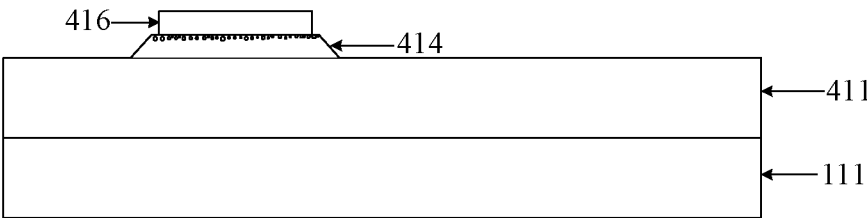
FIG. 27 is a schematic diagram of another structure of the base substrate in the method shown in FIG. 22.

Illustratively, as shown in FIG. 27, FIG. 27 is a schematic diagram of another structure of the base substrate after S606 is performed. The gate insulation material layer is formed on the active layer 414, and the gate insulation structure 416 is formed by performing one patterning process on the gate insulation material layer.

In S607, a gate is formed on the gate insulation structure.

The gate may be formed from a metal material. A gate metal layer may be formed on the gate insulation structure by depositing, and the gate may be formed by performing one patterning process on the gate metal layer.

Illustratively, as shown in FIG. 28, FIG. 28 is a schematic diagram of another structure of the base substrate after S607 is performed. The gate metal layer is formed on the gate insulation structure 416, and the gate 417 is formed by performing one patterning process on the gate metal layer.

In summary, a method for manufacturing a metal-oxide TFT is provided in the embodiments of the present disclosure. In the method, after the active layer including the metal oxide semiconductor and the functional layer laminated on the active layer and containing the lanthanide element are formed on the base substrate, the active layer and the functional layer are annealed, such that the lanthanide element in the functional layer is diffused into the active layer. The lanthanide element diffused into the active layer may form a trap state in the active layer, and photo-generated electrons generated after the active layer is lighted may be captured by the trap state. Therefore, the illuminance stability of the active layer is improved, a problem of poor light stability of the active layer of the metal-oxide TFT in the related art may be solved, and an effect of light stability of the active layer of the metal-oxide TFT may be improved.

FIG. 29 is a flowchart of another method for manufacturing a metal-oxide TFT according to an embodiment of the present disclosure. The method may include the following processes.

In S701, a base substrate is acquired.

In S702, a buffer layer and a metal-oxide-semiconductor thin film are successively formed on the base substrate.

Both the buffer layer and the metal-oxide-semiconductor thin film are entire layer structures, and are successively covered on the base substrate. The buffer layer may be formed by a silicon nitride material, and the buffer layer and the metal-oxide-semiconductor thin film may be formed by depositing.

Figure 30:
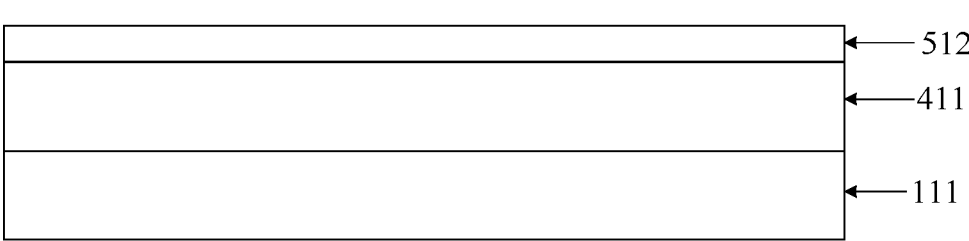
FIG. 30 is a schematic diagram of another structure of the base substrate in the method shown in FIG. 29.

Illustratively, as shown in FIG. 30, FIG. 30 is a schematic diagram of another structure of the base substrate after S702 is performed. The buffer layer 411 and an active layer thin film 512 are formed on the base substrate 411.

In S703, an active layer is acquired by processing the metal-oxide-semiconductor thin film.

A material of the active layer may be referred to the material of the active layer in the embodiments of FIG. 2. The active layer may be acquired by performing one patterning process on the metal-oxide-semiconductor thin film.

Figure 31:
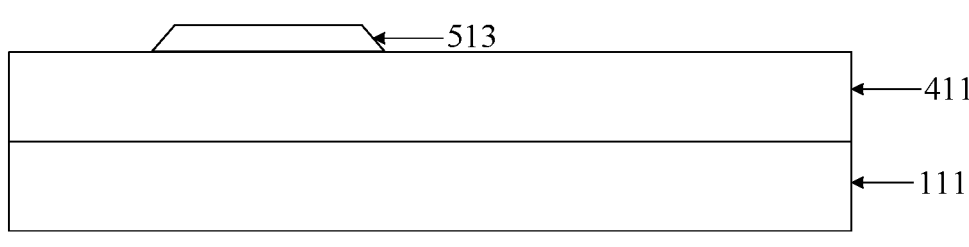
FIG. 31 is a schematic diagram of another structure of the base substrate in the method shown in FIG. 29.

Illustratively, as shown in FIG. 31, FIG. 31 is a schematic diagram of another structure of the base substrate after S702 is performed. The active layer 513 may be acquired by performing one patterning process on the metal-oxide-semiconductor thin film.

In S704, a thin film containing the lanthanide element is formed on the base substrate including the active layer.

S704 may be referred to S505 in the embodiments of FIG. 14, which is not limited in the embodiments of the present disclosure.

Figure 32:
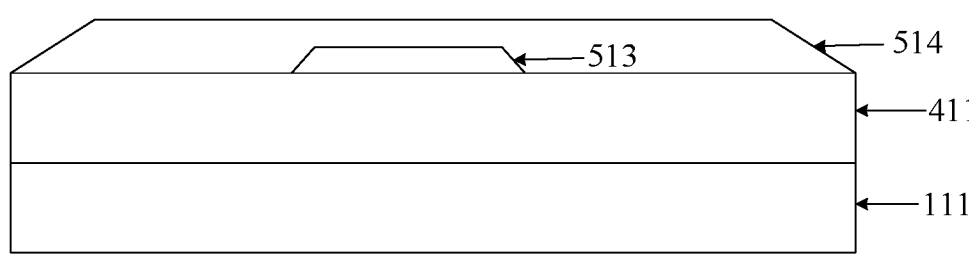
FIG. 32 is a schematic diagram of another structure of the base substrate in the method shown in FIG. 29.

As shown in FIG. 32, FIG. 32 is a schematic diagram of another structure of the base substrate after S704 is performed. The thin film 514 including the lanthanide element is formed on the base substrate 111 including the active layer 513.

In S705, the active layer and the thin film containing the lanthanide element are annealed, such that the lanthanide element in the thin film containing the lanthanide element is diffused into the active layer.

S705 may be referred to S506 in the embodiments of FIG. 14, which is not limited in the embodiments of the present disclosure.

Figure 33:
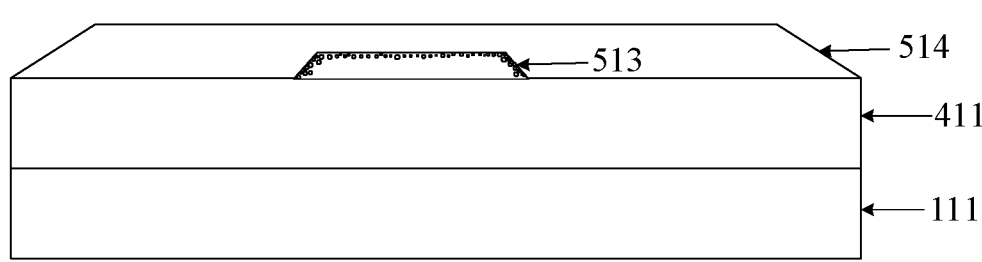
FIG. 33 is a schematic diagram of another structure of the base substrate in the method shown in FIG. 29.

As shown in FIG. 33, FIG. 33 is a schematic diagram of another structure of the base substrate after S705 is performed. The active layer 513 and the thin film 514 including the lanthanide element are annealed, such that the lanthanide element in the thin film 514 including the lanthanide element is diffused into the active layer 513.

In S706, the thin film containing the lanthanide element is removed.

S706 may be referred to S507 in the embodiments of FIG. 14, which is not limited in the embodiments of the present disclosure.

Figure 34:
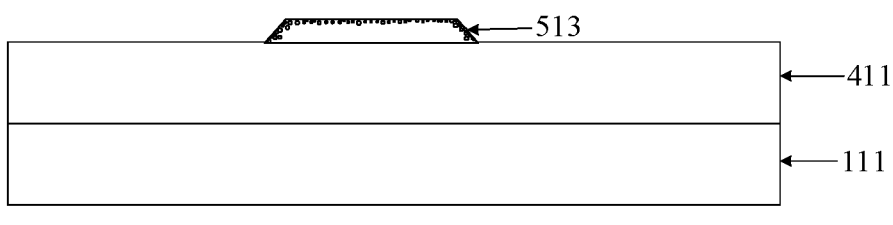
FIG. 34 is a schematic diagram of another structure of the base substrate in the method shown in FIG. 29.

As shown in FIG. 34, FIG. 34 is a schematic diagram of another structure of the base substrate after S706 is performed. The entire thin film containing the lanthanide element is etched, and the active layer 513 with the great corrosion resistance property is remained.

In S707, the gate insulation structure is formed on the active layer.

S707 may be referred to S606 in the embodiments of FIG. 22, which is not limited in the embodiments of the present disclosure.

Figure 35:
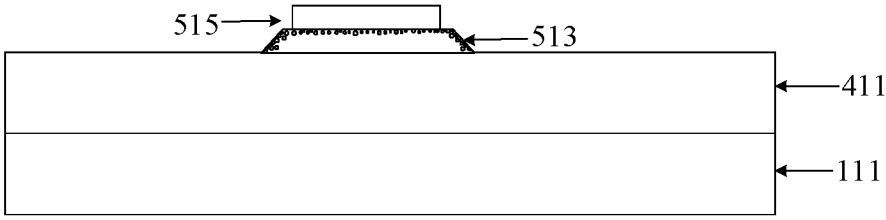
FIG. 35 is a schematic diagram of another structure of the base substrate in the method shown in FIG. 29.

Illustratively, as shown in FIG. 35, FIG. 35 is a schematic diagram of another structure of the base substrate after S707 is performed. A gate insulation material layer may be formed on the active layer 513, and the gate insulation structure 513 is formed by performing one patterning process on the gate insulation material layer.

In S708, a gate is formed on the gate insulation structure.

S708 may be referred to S607 in the embodiments of FIG. 22, which is not limited in the embodiments of the present disclosure.

Figure 36:
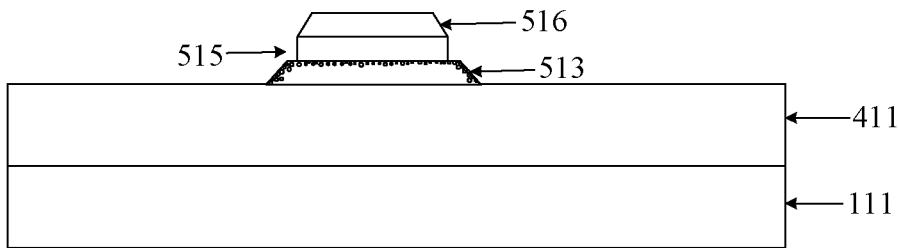
FIG. 36 is a schematic diagram of another structure of the base substrate in the method shown in FIG. 29.

Illustratively, as shown in FIG. 36, FIG. 36 is a schematic diagram of another structure of the base substrate after S708 is performed. The gate metal layer is formed on the gate insulation structure 515, and the gate 516 is formed by performing one patterning process on the gate metal layer.

In summary, a method for manufacturing a metal-oxide TFT is provided in the embodiments of the present disclosure. In the method, after the active layer including the metal oxide semiconductor and the functional layer laminated on the active layer and containing the lanthanide element are formed on the base substrate, the active layer and the functional layer are annealed, such that the lanthanide element in the functional layer is diffused into the active layer. The lanthanide element diffused into the active layer may form a trap state in the active layer, and photo-generated electrons generated after the active layer is lighted may be captured by the trap state. Therefore, the illuminance stability of the active layer is improved, a problem of poor light stability of the active layer of the metal-oxide TFT in the related art may be solved, and an effect of light stability of the active layer of the metal-oxide TFT may be improved.

A metal-oxide TFT is provided in the embodiments of the present disclosure, and the metal-oxide TFT may be manufactured by the method for manufacturing the metal-oxide TFT in above embodiments.

The metal-oxide TFT may include an active layer, on a base substrate, including a metal oxide semiconductor, and the active layer contains a lanthanide element.

Illustratively, the metal-oxide TFT may be referred to FIGS. 10, 13, 21, 28 and 36. As shown in FIG. 10, the active layer 116 is disposed on the base substrate 111, and the lanthanide element in the active layer 116 may improve the light stability of the active layer 116.

In summary, a metal-oxide TFT is provided in the embodiments of the present disclosure. The metal-oxide TFT may include the active layer, on a base substrate, including a metal oxide semiconductor, and the active layer contains the lanthanide element. The lanthanide element in the active layer may form a trap state in the active layer, and photo-generated electrons generated after the active layer is lighted may be captured by the trap state. Therefore, the illuminance stability of the active layer is improved, a problem of poor light stability of the active layer of the metal-oxide TFT in the related art may be solved, and an effect of light stability of the active layer of the metal-oxide TFT may be improved.

Figure 37:
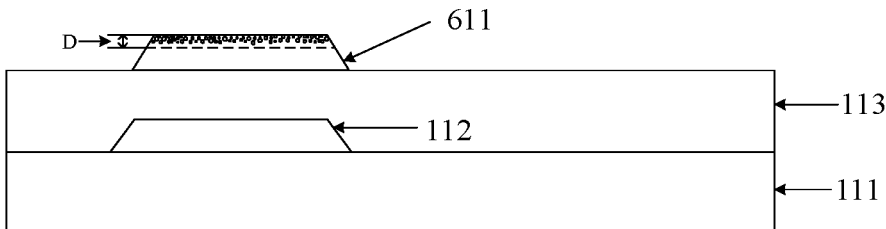
FIG. 37 is a schematic structural diagram of a metal-oxide TFT according to an embodiment of the present disclosure.

As shown in FIG. 37, FIG. 37 is a schematic structural diagram of a metal-oxide TFT according to an embodiment of the present disclosure. Optionally, the lanthanide element Ln is diffused into a material at a specified depth D of a face, distal from the base substrate, of the active layer 611. The lanthanide element Ln diffused into the material at the specified depth D may reduce an effect of light, irradiated from a position above the active layer 611 to the active layer 611, on the active layer 611.

It should be note from above embodiments that, the face, distal from the base substrate, of the active layer is a face, in contact with the functional layer including the lanthanide element, of the active layer. Therefore, the lanthanide element may be diffused into the active layer from the face, and the lanthanide element may be mainly distributed in a side, distal from the base substrate, of the active layer.

Figure 38:
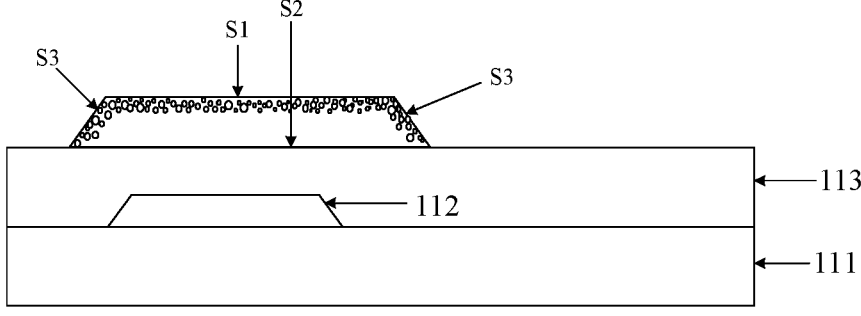
FIG. 38 is a schematic structural diagram of another metal-oxide TFT according to an embodiment of the present disclosure.

As shown in FIG. 38, FIG. 38 is a schematic structural diagram of another metal-oxide TFT according to an embodiment of the present disclosure. Optionally, the active layer is a single layer and a channel layer of the TFT, and is defined by a top face S1, a bottom face S2, and a side face S3 connected between the top face and the bottom face, and the face, distal from the base substrate, of the active layer includes the top face S1 and the side face S3 of the active layer.

Optionally, a mass percentage of the lanthanide element in the active layer decreases in a direction facing towards the base substrate. As the lanthanide element is diffused into an interior of the active layer from the face, distal from the base substrate, of the active layer in annealing, the mass percentage of the lanthanide element in the active layer decreases in the direction facing towards the base substrate.

Optionally, the lanthanide element includes one or more of praseodymium, samarium, and cerium, and the lanthanide element may include one or more of lanthanide elements.

Optionally, as shown in FIG. 37, the specified depth D is less than or equal to 10 nm. In this range, a light stability layer may improve the light stability of the active layer. In the case that the specified depth D is greater than or equal to 5 nm, the light stability layer may greatly improve the light stability of the active layer.

Optionally, the metal-oxide TFT may further include a source-drain electrode, and a metal layer disposed between the active layer and the source-drain electrode and containing the lanthanide element. The source-drain electrode includes a source electrode and a drain electrode, and a material of the metal layer includes a single-metal oxide or a multi-metal oxide containing the lanthanide element.

As shown in FIG. 13, the metal layer 1171 including the lanthanide element is disposed between the active layer 116 and the source-drain electrode, and the source-drain electrode includes the source electrode 212 and the drain electrode 213.

Optionally, the mass percentage of the lanthanide element in the active layer is greater than or equal to 0.5%, and is less than or equal to 10%. In this range, the light stability layer may improve the light stability of the active layer.

Illustratively, as shown in FIG. 37, the metal-oxide TFT may further include the gate 112 and the gate insulation layer 113. The gate 112 is disposed on the base substrate 111, and the gate insulation layer 113 is disposed on the base substrate 111 including the gate 112. The active layer 611 is disposed on the gate insulation layer 113.

In summary, a metal-oxide TFT is provided in the embodiments of the present disclosure. The metal-oxide TFT may include the active layer, on a base substrate, including a metal oxide semiconductor, and the active layer contains the lanthanide element. The lanthanide element in the active layer may form a trap state in the active layer, and photo-generated electrons generated after the active layer is lighted may be captured by the trap state. Therefore, the illuminance stability of the active layer is improved, a problem of poor light stability of the active layer of the metal-oxide TFT in the related art may be solved, and an effect of light stability of the active layer of the metal-oxide TFT may be improved.

An x-ray detector is further provided in the embodiments of the present disclosure. The x-ray detector may include the metal-oxide TFT in FIGS. 10, 13, 21, 28 and 36. The x-ray detector may include a substrate, a plurality of detection units on the substrate, and a scintillator layer on the plurality of detection units. Each of the plurality of detection units may include the metal-oxide TFT and a photosensitive structure. The photosensitive structure is disposed on the drain electrode of the metal-oxide TFT, and is electronically connected to the metal-oxide TFT. The scintillator layer is configured to convert the x-ray to visible light, the photosensitive structure is configured to convert the visible light to an electrical signal, and the metal-oxide TFT acts as a switch for reading the electrical signal.

A display panel is further provided in the embodiments of the present disclosure. The display panel may include the metal-oxide TFT in FIGS. 10, 13, 21, 28 and 36. The display panel may be integrated in products or parts with a display function, such as a liquid crystal panel, electronic paper, a mobile phone, a tablet computer, a television, a notebook computer, a digital photo frame, a navigator, and the like.

Figure 39:
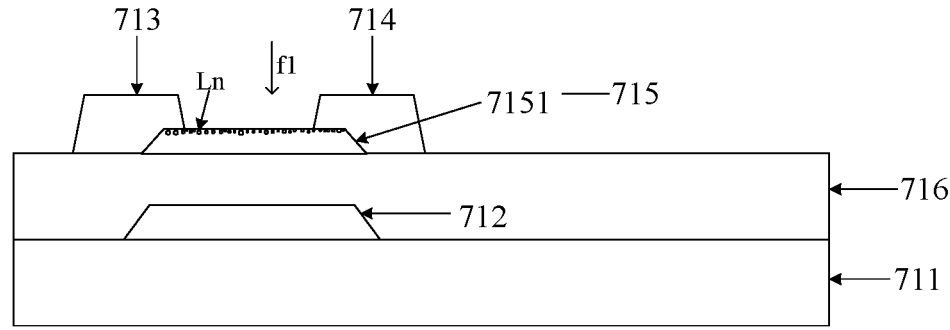
FIG. 39 is a schematic structural diagram of another metal-oxide TFT according to an embodiment of the present disclosure.

Another metal-oxide TFT is further provided in the embodiments of the present disclosure, and the metal-oxide TFT may be manufactured by the method for manufacturing the metal-oxide TFT in above embodiments. As shown in FIG. 39, FIG. 39 is a schematic structural diagram of another metal-oxide TFT according to an embodiment of the present disclosure, and the metal-oxide TFT includes:

a gate 712, a source electrode 713, a drain electrode 714, and an active layer 715 that are disposed on a base substrate 711; wherein the active layer 715 is disposed between the gate 712 and the source electrode 713 or the drain electrode 714, and the active layer 715 includes a channel layer 7151, wherein the channel layer 7151 is a first metal oxide semiconductor layer. The metal-oxide TFT further includes a gate insulation layer 716.

The first metal oxide semiconductor layer includes one or more of indium (In), gallium (Ga), zinc (Zn), stannum (Sn), aluminum (Al), wolfram (W), zirconium (Zr), hafnium (Hf), and silicon (Si). The channel layer 7151 includes a material doped with the lanthanide element. The material doped with the lanthanide element may form a trap state in the active layer, and photo-generated electrons generated after the active layer is lighted may be captured by the trap state, such that, the illuminance stability of the active layer is improved.

In some embodiments, the material doped with a lanthanide element is present in an upper face of the channel layer and a position with a thickness from the upper face, a content of the lanthanide element decreases in a direction away from the upper face of the channel layer.

In some embodiments, in a position or a thickness range of the channel layer 7151, a content of the lanthanide element close to a center of the channel layer is greater than a content of the lanthanide element away from the center of the channel layer in a thickness direction f1 from the upper face (a position of a back channel) of the channel layer to a center of the channel layer. The active layer 715 may include a top face and side face distal from the base substrate. As a functional layer including a lanthanide element may be laminated on the top face, on a side distal from the base substrate, of the active layer prior to annealing, the lanthanide element may be diffused from the top face, on a side distal from the base substrate, of the active layer to an interior of the active layer in annealing, and both sides of side faces of the active layer may include less lanthanide element. Therefore, the channel layer 7151 may be formed, and the content of the lanthanide element close to the center of the channel layer 7151 is greater than the content of the lanthanide element away from the center of the channel layer 7151.

In summary, a metal-oxide TFT is provided in the embodiments of the present disclosure. The active layer of the metal-oxide TFT may include the channel layer including the material doped with the lanthanide element. The lanthanide element in the material doped with the lanthanide element may form a trap state in the active layer, and photo-generated electrons generated after the active layer is lighted may be captured by the trap state. Therefore, the illuminance stability of the active layer is improved, a problem of poor light stability of the active layer of the metal-oxide TFT in the related art may be solved, and an effect of light stability of the active layer of the metal-oxide TFT may be improved.

Figure 40:
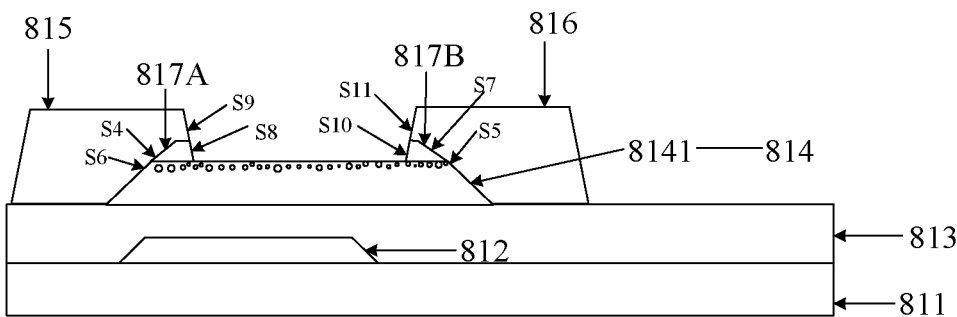
FIG. 40 is a schematic structural diagram of another metal-oxide TFT according to an embodiment of the present disclosure.

Optionally, as shown in FIG. 40, FIG. 40 is a schematic structural diagram of another metal-oxide TFT according to an embodiment of the present disclosure. A source electrode 815 and a drain electrode 816 are disposed on an active layer 814, and a metal layer 817A is disposed between a channel layer 8141 of the active layer 814 and the source electrode 815. The metal layer 817A includes a lanthanide element the same as the material doped with the lanthanide element. A metal layer 817B is disposed between the channel layer 8141 of the active layer 814 and the drain electrode 816, and the metal layer 817B includes a lanthanide element the same as the material doped with the lanthanide element. The metal-oxide TFT may further include a base substrate 811, a gate 812, and a gate insulation layer 813.

As film layers of the two metal layers and the source-drain electrode metal layer may be processed by one patterning process in manufacturing the metal-oxide TFT, the metal layer may be formed between the channel layer of the active layer and the source electrode upon the one patterning process, and the one patterning process may reduce the processes of manufacturing the metal-oxide TFT. As the metal layer below the source electrode and the drain electrode may be formed by one film layer, a thickness of the metal layer between the source electrode and the channel layer is equal to a thickness of the metal layer between the drain electrode and the channel layer. The same thickness of the metal layers may ensure balance the properties of the source electrode and the drain electrode.

Optionally, as shown in FIG. 40, an outer sidewall S4 (the outer sidewall of the metal layer may be a sidewall of a side along an outward direction from the center of the channel layer) of the metal layer 817A between the source electrode 815 and the channel layer 8141 and one outer sidewall S6 of the channel layer 8141 are disposed on a same slope face, and have a same slope angle direction. An outer sidewall S5 of the metal layer 817B between the drain electrode 816 and the channel layer 8141 and another outer sidewall S7 of the channel layer are disposed on a same slope face, and have a same slope angle direction. In such way, a poor contact between the source-drain electrode and the active layer caused by irregular outer sidewalls of the metal layer and active layer may be avoided, and the properties of the metal-oxide TFT may be further improved. The outer sidewalls S6 and S4 are formed in one patterning process, and the outer sidewalls S7 and S5 are formed in one patterning process.

An inner sidewall S8 of the metal layer 817A between the source electrode 815 and the channel layer 8141 and an inner sidewall S9 of the source electrode 815 are disposed on a same slope face, and have a same slope angle direction. An inner sidewall S10 of the metal layer 817B between the drain electrode 816 and the channel layer 8141 and an inner sidewall S11 of the drain electrode 816 are disposed on a same slope face, and have a same slope angle direction. In such way, a crack between the source-drain electrode and the active layer caused by irregular inner sidewalls of the source-drain electrode and the active layer may be avoided, and the properties of the metal-oxide TFT may be further improved.

Figure 41:
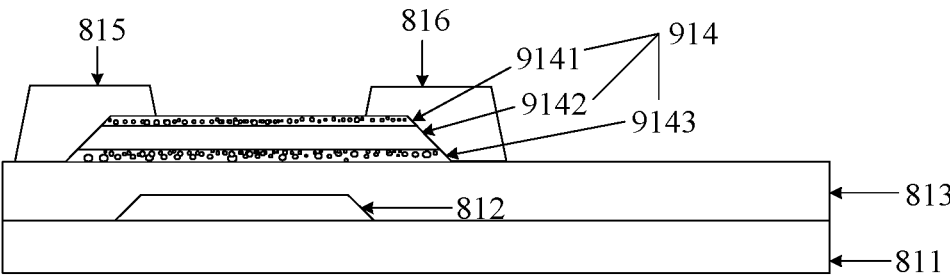
FIG. 41 is a schematic structural diagram of another metal-oxide TFT according to an embodiment of the present disclosure.

Optionally, as shown in FIG. 41, FIG. 41 is a schematic structural diagram of another metal-oxide TFT according to an embodiment of the present disclosure. The active layer 914 may further include a back channel protective layer 9141, and the channel layer may be doped with an amorphous indium-gallium-tin oxide (a-IGTO) of the lanthanide element, and may possesses great mobility (for example, greater than 30). The back channel protective layer 9141 is disposed on the channel layer 9142, and the back channel protective layer 9141 may be a polycrystalline indiumgallium-zinc oxide (p-IGZO), a lanthanide element-doped indium-zinc oxide (Ln-IZO), or a lanthanide element-doped indium-gallium-zinc oxide (Ln-IGZO), such that the back channel protective layer may possesses an acid corrosion resistance, and the stability of the active layer may be improved.

Optionally, as shown in FIG. 41, the active layer further includes a light blocking protective layer 9143. The light blocking protective layer 9143 contains a lanthanide element (such as praseodymium(Pr)) doped indium-zinc oxide (Ln-IZO) or lanthanide element doped indium-gallium-tin oxide (Ln-IGZO), and the light blocking protective layer 9143 is disposed on a side, distal from the back channel protective layer 9141, of the channel layer 9142. In this way, light in a back side may be irradiated to the channel layer, such that the light stability of the active layer may be further improved, and the leakage current is reduced.

In summary, a metal-oxide TFT is provided in the embodiments of the present disclosure. The active layer of the metal-oxide TFT may include the channel layer including the material doped with the lanthanide element. The lanthanide element in the material doped with the lanthanide element may form a trap state in the active layer, and photo-generated electrons generated after the active layer is lighted may be captured by the trap state. Therefore, the illuminance stability of the active layer is improved, a problem of poor light stability of the active layer of the metal-oxide TFT in the related art may be solved, and an effect of light stability of the active layer of the metal-oxide TFT may be improved.

Described above are example embodiments of the present disclosure, and are not intended to limit the present disclosure. Any modifications, equivalent replacements, improvements and the like made within the spirit and principles of the present disclosure should be included within the scope of protection of the present disclosure.

What is claimed is:

1. A method for manufacturing a metal-oxide thin-film transistor (TFT), comprising:

forming, on a base substrate, an active layer comprising a metal oxide semiconductor, and a functional layer laminated on the active layer and containing a lanthanide element; and annealing the active layer and the functional layer, such that the lanthanide element in the functional layer is diffused into the active layer, wherein upon annealing the active layer and the functional layer, the method further comprises:

removing the functional layer.

2. The method according to claim 1, wherein the annealing is carried out at a temperature ranging from 200 to 450° C., for a time duration ranging from 0.5 to 3 h, and in an atmosphere containing dry air or oxygen.

3. The method according to claim 1, wherein forming, on the base substrate, the active layer comprising the metal oxide semiconductor, and the functional layer laminated on the active layer and containing the lanthanide element comprises:

successively forming a metal-oxide-semiconductor thin film and a thin film containing the lanthanide element on the base substrate;

forming a first photoresist pattern on the thin film containing the lanthanide element;

forming the active layer and the functional layer laminated on the active layer by etching the metal-oxide-semiconductor thin film and the thin film containing the lanthanide element using a same etching solution; and removing the first photoresist pattern.

4. The method according to claim 1, wherein removing the functional layer comprises:

forming a source-drain electrode metal layer on the base substrate comprising the functional layer;

forming a second photoresist pattern on the source-drain electrode metal layer; and etching the source-drain electrode metal layer and the functional layer, such that the source-drain electrode metal layer forms a source-drain electrode, and a portion, outside a first region, of the functional layer is etched, wherein the first region is an orthographic projection region of the source-drain electrode on the active layer, and the source-drain electrode comprises a source electrode and a drain electrode.

5. The method according to claim 1, wherein forming, on the base substrate, the active layer comprising the metal oxide semiconductor, and the functional layer laminated on the active layer and containing the lanthanide element comprises:

forming the active layer on the base substrate;

forming a thin film containing the lanthanide element on the base substrate comprising the active layer, wherein the active layer is defined by a top face, a bottom face, and a side face connected between the top face and the bottom face, the bottom face facing towards the base substrate, and the thin film containing the lanthanide element covering the top face and the side face of the active layer; and annealing the active layer and the functional layer comprises:

annealing the active layer and the thin film containing the lanthanide element, such that the lanthanide element is diffused from the thin film containing the lanthanide element into the top face and the side face of the active layer.

6. The method according to claim 1, wherein a material of the functional layer comprises a single-metal oxide or a multi-metal oxide containing the lanthanide element.

7. The method according to claim 1, wherein a material of the functional layer comprises one or more of a praseodymium oxide, a samarium oxide, a cerium oxide, an indium-zinc-praseodymium oxide, and an indium-zinc-samarium oxide.

* * * * *